(12) United States Patent
Huang et al.

(10) Patent No.: US 12,382,838 B2
(45) Date of Patent: Aug. 5, 2025

(54) SEMICONDUCTOR MEMORY DEVICE WITH SPACER PROTECTION AND METHOD FOR FORMING SAME USING MULTI-STEP PATTERNING

(71) Applicant: Taiwan Semiconductor Manufacturing Company, Ltd., Hsin-Chu (TW)

(72) Inventors: Chih-Fan Huang, Kaohsiung (TW); Po-Sheng Lu, Hsinchu (TW); Chen-Chiu Huang, Taichung (TW); Dian-Hau Chen, Hsinchu (TW); Yen-Ming Chen, Hsin-Chu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 754 days.

(21) Appl. No.: 17/524,041

(22) Filed: Nov. 11, 2021

(65) Prior Publication Data

US 2022/0359819 A1    Nov. 10, 2022

Related U.S. Application Data

(60) Provisional application No. 63/185,439, filed on May 7, 2021.

(51) Int. Cl.
*H10N 50/01* (2023.01)
*H10B 61/00* (2023.01)
*H10N 50/80* (2023.01)

(52) U.S. Cl.
CPC ............ *H10N 50/01* (2023.02); *H10B 61/00* (2023.02); *H10N 50/80* (2023.02)

(58) Field of Classification Search
CPC ......... H10N 50/01; H10N 50/80; H10B 61/00
USPC ........................................................ 257/421
See application file for complete search history.

(56) References Cited

U.S. PATENT DOCUMENTS

| | | | |
|---|---|---|---|
| 10,522,749 B2 | 12/2019 | Shen et al. | |
| 2016/0133833 A1* | 5/2016 | Lu | H10N 50/01 438/3 |
| 2020/0136026 A1* | 4/2020 | Peng | H10N 50/80 |
| 2021/0098685 A1 | 4/2021 | Liou et al. | |
| 2021/0098695 A1* | 4/2021 | Peng | H10N 50/01 |
| 2021/0336130 A1* | 10/2021 | Chien | H10N 50/01 |

* cited by examiner

*Primary Examiner* — Jami Valentine Miller
(74) *Attorney, Agent, or Firm* — HAYNES AND BOONE, LLP

(57) ABSTRACT

A method includes forming a magnetic tunnel junction (MTJ) stack over a substrate. The MTJ stack including a top magnetic layer, a barrier layer, and a bottom magnetic layer. The method also includes patterning the top magnetic layer in a first etch process, after the patterning of the top magnetic layer depositing a spacer on sidewalls of the patterned top magnetic layer, and patterning the bottom magnetic layer in a second etch process.

20 Claims, 22 Drawing Sheets

SEMICONDUCTOR MEMORY DEVICE WITH SPACER PROTECTION AND METHOD FOR FORMING SAME USING MULTI-STEP PATTERNING

PRIORITY

This application claims the benefits to U.S. Provisional Application No. 63/185,439, filed May 7, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and particularly magnetic random-access memory (MRAM). In some implementations, MRAM can offer comparable performance to volatile static random-access memory (SRAM) and comparable density with lower power consumption than volatile dynamic random-access memory (DRAM). Compared to NVM Flash memory, MRAM may offer faster access and suffer less degradation over time. An MRAM cell is formed by a magnetic tunneling junction (MTJ) comprising two ferromagnetic layers which are separated by a thin insulating barrier layer and operate by tunneling of electrons between the two ferromagnetic layers through the insulating barrier layer. Although existing approaches in MRAM device formation have generally been adequate for their intended purposes, they have not been entirely satisfactory in all respects. For example, patterning the entire MTJ stack of layers in a single etch transfer process is challenging, as byproducts during the etch transfer process—particularly metal particles—may be redeposited on MTJ sidewalls, causing shorting and rendering the device malfunctioned.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
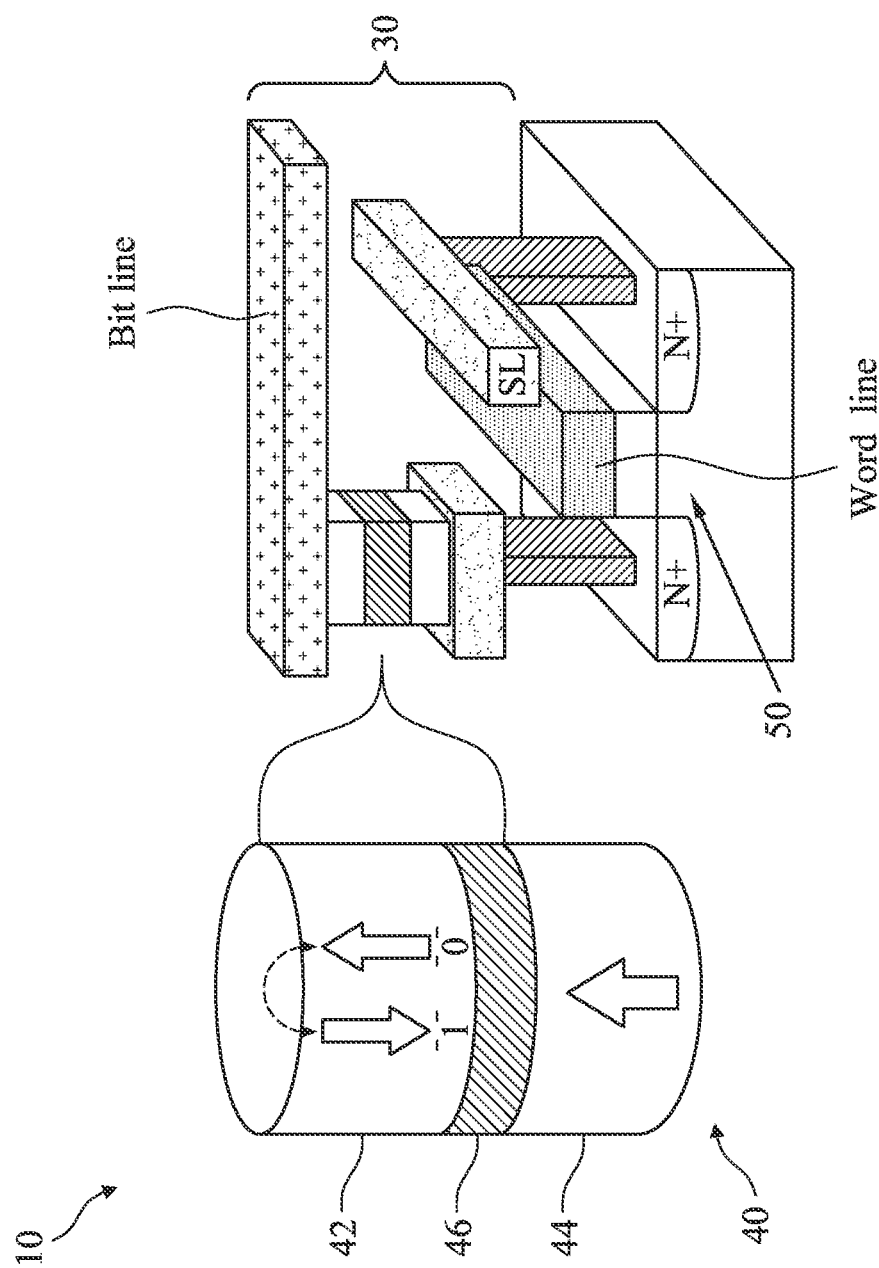
FIGS. 1A and 1B illustrate perspective views of a semiconductor device with an MRAM integrated therein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/-10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with an array of MRAM devices (or cells) where the MTJ stacks are patterned through a two-step etch process with a spacer formation between the first step etch process and the second step etch process. The spacer protects the MTJ sidewalls from metal particle redeposition that usually occurs during the etch process and thus ensures the integrity of the array of MRAM devices.

In some embodiments, the MRAM devices are provided in a memory device region (or MRAM region) of the semiconductor device and logic devices are provided in a logic device region (or logic region) of the semiconductor device. The memory device region may include an array of MRAM devices arranged into row and columns. The MRAM devices in the same row are connected to a common word line, and the MRAM devices in the same column are connected to a common bit line. The array may be connected to and controlled by the logic devices in the logic region.

The MRAM devices of the present disclosure may be formed over a semiconductor structure that includes a semiconductor substrate. Upon the semiconductor substrate certain devices may be formed such as field effect transistors (FET) having the associated gate, source, and drain features. Also disposed on the semiconductor structure may be one or more layers of a multi-layer interconnect (or MLI) that includes horizontally extending conductive lines (e.g., metallization layers) and vertically extending conductive vias. The MLI may interconnect one or more of the devices (e.g., FETs) formed on the substrate. In an embodiment, at least one metallization layer of the MLI is formed on the semiconductor structure, while other metallization layers of the MLI may be formed after (e.g., above) the MRAM device fabricated as discussed below. In other words, the MRAM device is disposed within a metallization layer of the MLI.

Figure 1B:
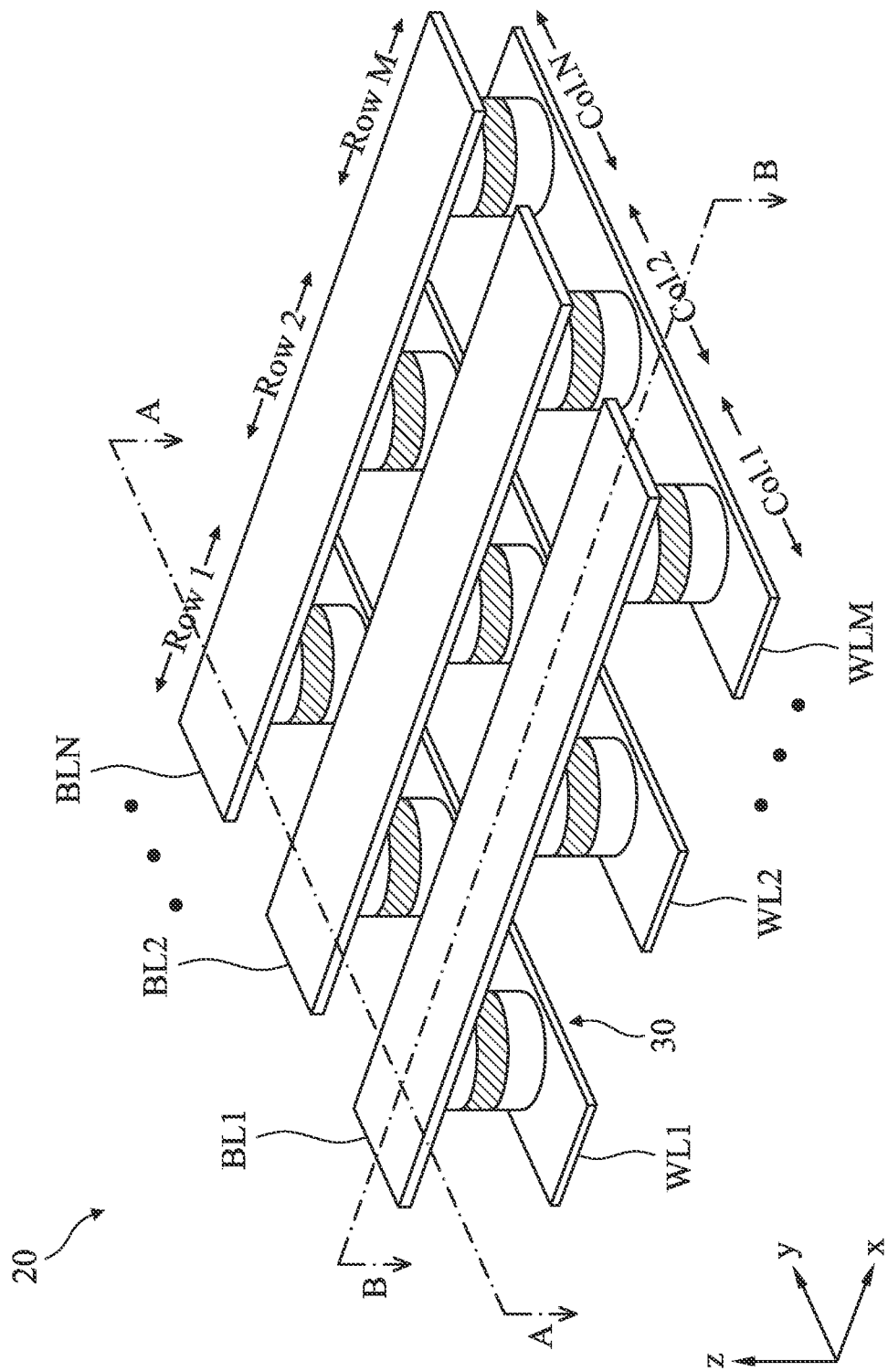

FIGS. 1A and 1B illustrate perspective views of a semiconductor device 10 having an MRAM array 20. Particularly, FIG. 1A illustrates a building block of the MRAM array 20—an MRAM cell 30 having an MTJ 40 (or MTJ stack 40). The MTJ 40 includes an upper magnetic plate 42 (or top magnetic plate) and a lower magnetic plate 44 (or bottom magnetic plate), which are separated by a thin insulating layer 46, also referred to as a tunnel barrier layer. One of the two magnetic plates (e.g., the lower magnetic plate 44) includes a magnetic layer that is pinned (thus referred to as a pinned layer or a reference layer) to an antiferromagnetic layer (referred to as a pinning layer), while the other magnetic plate (e.g., the upper magnetic plate 42) is a "free" magnetic layer (also referred to as a free layer) that can have its magnetic field changed to one of two or more values to store one of two or more corresponding data states. FIG. 1B illustrates an MRAM array 20, which includes M rows (words) and N columns (bits) of MRAM cells 30. Each MRAM cell 30 comprises an MTJ 40. Word lines $WL_1$, $WL_2$, ... $WL_M$ extend across respective rows of MRAM cells 30 and bit lines $BL_1$, $BL_2$, ... $BL_N$ extend along columns of MRAM cells 30.

The MTJ 40 uses tunnel magnetoresistance (TMR) to store magnetic fields on the upper and lower magnetic plates 42 and 44. For a sufficiently thin insulating layer 46 (e.g., about 10 nm or less thick), electrons can tunnel from the upper magnetic plate 42 to the lower magnetic plate 44. Data may be written to the cell in many ways. In one method, current is passed between the upper and lower magnetic plates 42 and 44, which induces a magnetic field stored in the free layer (e.g., the upper magnetic plate 42). In another method, spin-transfer-torque (STT) is utilized, wherein a spin-aligned or polarized electron flow is used to change the magnetic field within the free layer with respect to the reference layer. Other methods to write data may be used. However, all data write methods include changing the magnetic field within the free layer with respect to the reference layer.

The electrical resistance of the MTJ 40 changes in accordance with the magnetic fields stored in the upper and lower magnetic plates 42 and 44, due to the magnetic tunnel effect. For example, when the magnetic fields of the upper and lower magnetic plates 42 and 44 are aligned (or in the same direction), the MTJ 40 is in a low-resistance state (i.e., a logical "0" state). When the magnetic fields of the upper and lower magnetic plates 42 and 44 are in opposite directions, the MTJ 40 is in a high-resistance state (i.e., a logical "1" state). The direction of the magnetic field of the upper magnetic plate 42 can be changed by passing a current through the MTJ 40. By measuring the electrical resistance between the upper and lower magnetic plates 42 and 44, a read circuitry coupled to the MTJ 40 can discern between the "0" and "1" states. FIG. 1A further shows that the upper magnetic plate 42 of an MTJ 40 is coupled to a bit line, the lower magnetic plate 44 of an MTJ 40 is coupled to a source (or drain) of a transistor in a transistor structure 50, the drain (or source) of the transistor is coupled to a select line (SL), and the gate of the transistor is coupled to a word line (WL). The MTJ 40 can be accessed (such as read or written) through the bit line, word line, and the select line. Since the MTJ 40 utilizes magnetization to store binary digitized information, there is a risk that metal particles as byproducts during the patterning of the MTJ stacks may be redeposited on sidewalls of the MTJ 40 shorting the upper magnetic plate 42 and the lower magnetic plate 44. An object of the present disclosure is to provide structures and method thereof that can protect the MTJ 40 from high risks of redeposited material on its sidewalls.

Figure 2A:
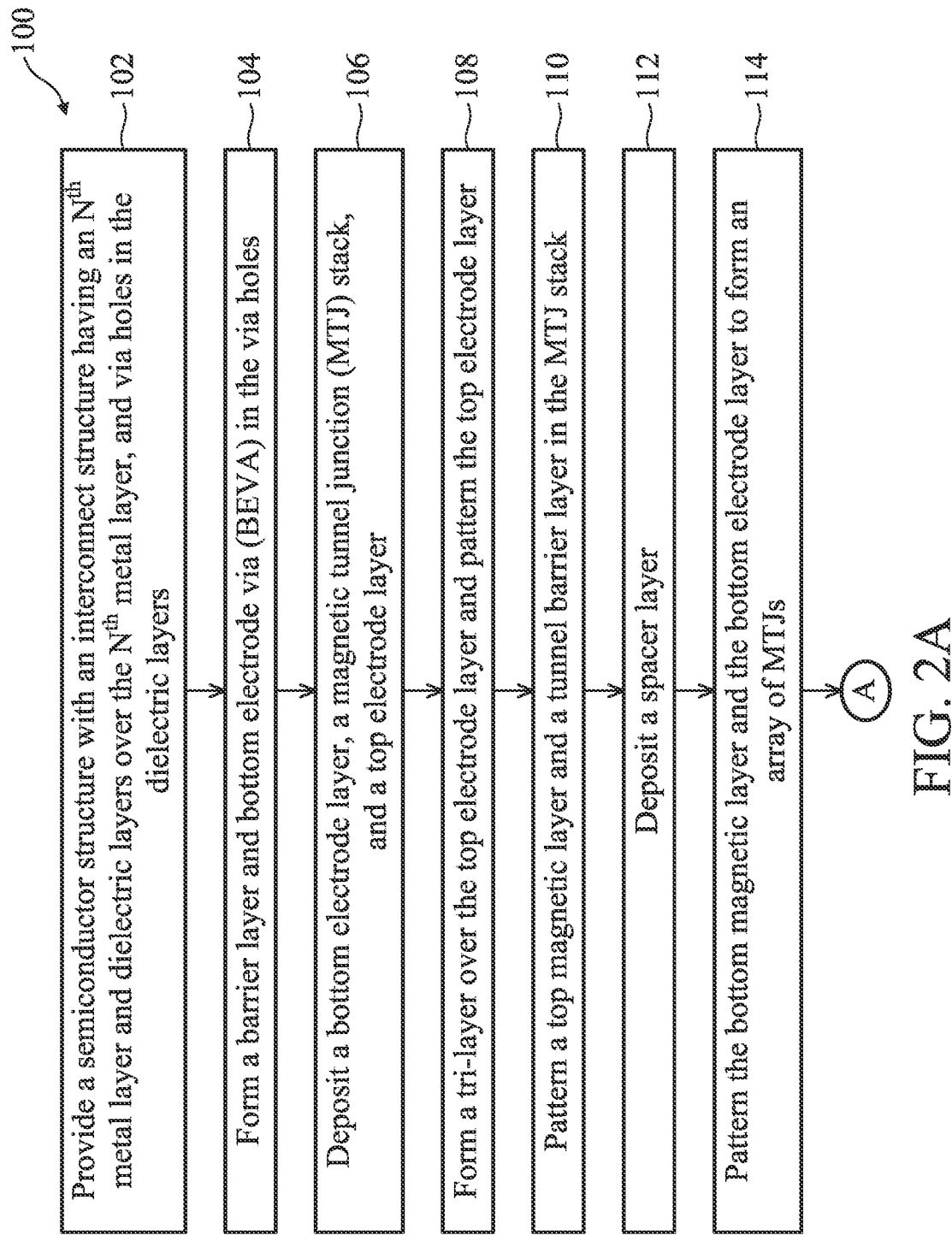
FIGS. 2A and 2B show a flow chart of a method for forming a semiconductor device with an MRAM array integrated therein, according to an embodiment of the present disclosure.
Figure 2B:
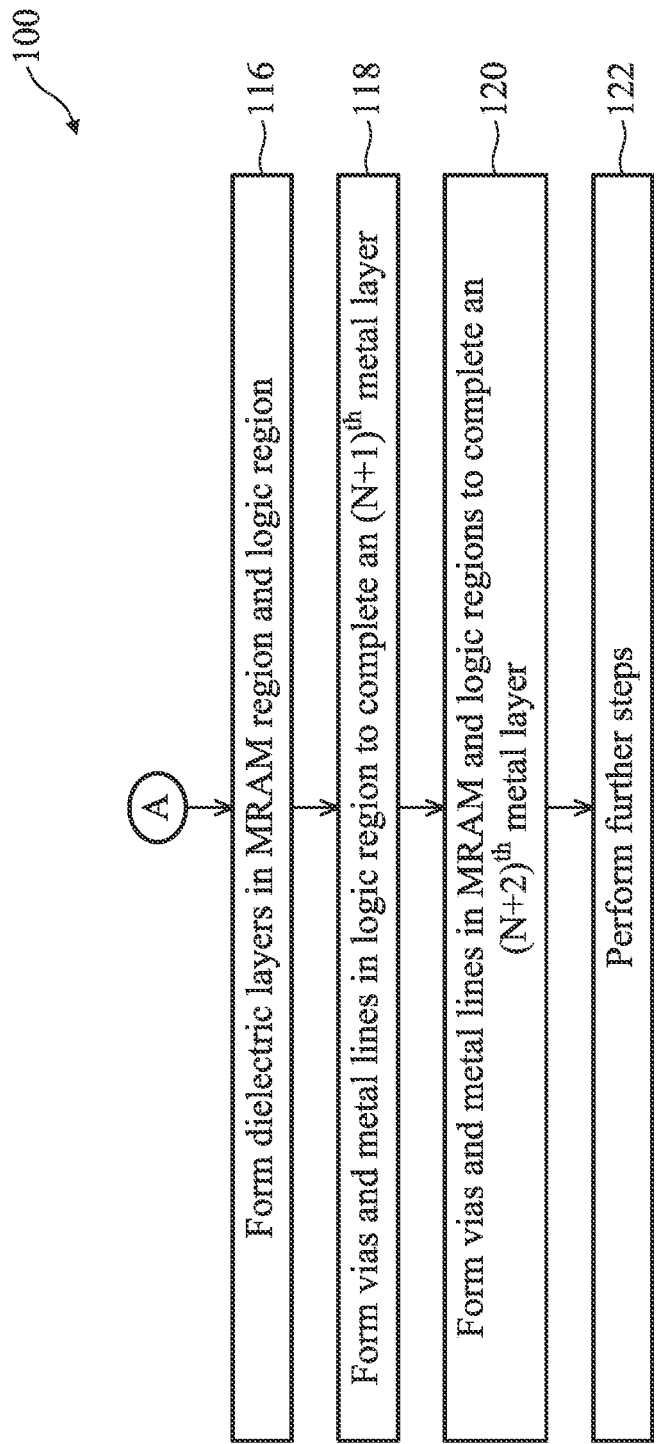

FIGS. 2A and 2B illustrate a flow chart of a method 100 for forming the semiconductor device 200 having an MRAM array and logic devices integrated in accordance with an embodiment. Many aspects of the semiconductor device 200 are the same as or similar to those of the semiconductor device 10 illustrated in FIGS. 1A and 1B. The semiconductor device 200 is provided for illustration purposes and does not necessarily limit the embodiments of the present disclosure to any number of devices, any number of regions, or any configuration of structures or regions. Furthermore, the semiconductor device 200 may be an intermediate device fabricated during processing of an integrated circuit (IC). The method 100 is merely an example, not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIG. 3 through FIG. 20, which illustrate various cross-sectional views of the semiconductor device 200 during fabrication steps according to the method 100.

At operation 102, the method 100 (FIG. 2A) provides, or is provided with, a semiconductor device 200 having an MRAM region 200A and a logic region 200B. The MRAM region 200A is used for forming an MRAM array therein and the logic region 200B is used for implementing write/read logic for accessing the MRAM array or perform other functions. The MRAM region 200A and the logic region 200B have a common semiconductor substrate 202 where transistors (not shown) are formed inside.

In some embodiments, the semiconductor substrate 202 may be but is not limited to, a silicon substrate (such as a silicon wafer). Alternatively, the semiconducotr substrate 202 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 202 is a semiconductor on insulator (SOI). In other alternatives, semiconductor substrate 202 may include a doped epitaxial layer, a gradient semiconductor layer, and/or a semiconductor layer overlying another semiconductor layer of a different type, such as a silicon layer on a silicon germanium layer. The semiconductor substrate 202 may further include passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. In some embodiments, transistors in the semiconductor substrate 202 can be planar transistors or non-planar transistors, such as FinFETs or gate-all-around (GAA) transistors.

The semiconductor device 200 further includes a multi-layer interconnect (MLI) structure over the semiconductor substrate 202. A metal layer 204 of the MLI structure is illustrated. The MLI structure includes multiple other metal layers not shown. For example, there are metal layers below the metal layer 204 in some embodiments. In the illustrated embodiment, the metal layer 204 is the Nth metal layer (denoted as $M_N$) above other N−1 metal layers underneath, while there could be more metal layers, such as the (N+1)th metal layer and the (N+2)th metal layer, subsequently formed above the Nth metal layer. The number N can be any natural number. For example, N may be 3, 4, 5, 6, or another natural number. The metal layer 204 includes an inter-metal dielectric (IMD) layer 206 and metal lines 208 in both the MRAM region 200A and the logic region 200B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof. The IMD layer 206 may be formed by deposition process, such as physical vapor deposition (PVD) or chemical vapor deposition (CVD) including plasma enhanced chemical vapor deposition (PECVD). The metal lines 208 be formed by a deposition process such as PVD, CVD, ALD, or a plating process. The metal line 208 in the MRAM region 200A functions as a word line for the to-be-formed MRAM array in the illustrated embodiment.

Figure 3:
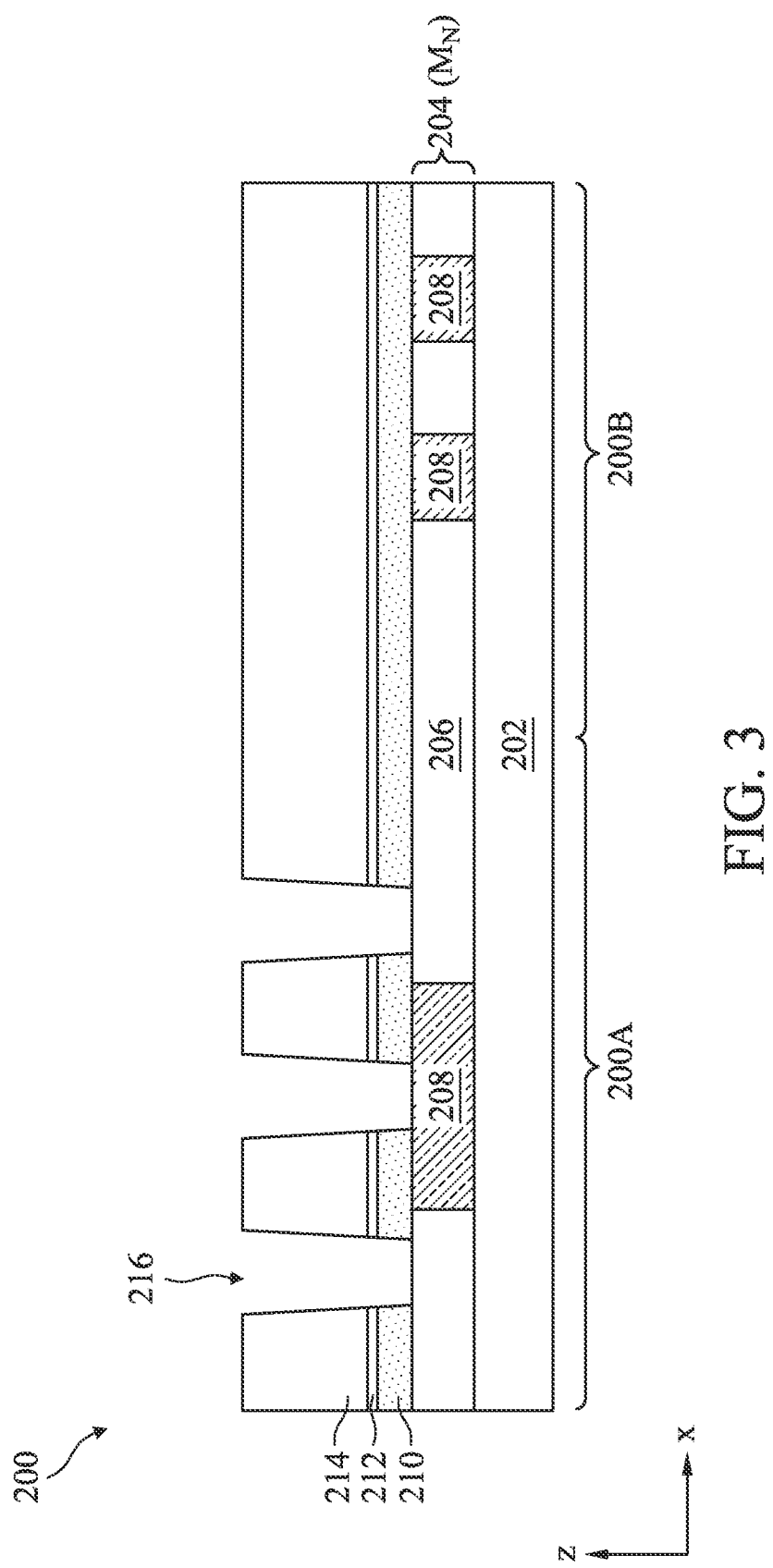
FIGS. 3, 4, 5, 6, 7, 8, 9, 10, 11, 12, 13, 14, 15, 16, 17, 18, and 19 illustrate cross-sectional views of a semiconductor structure during a fabrication process according to the method of FIGS. 2A and 2B, in accordance with some embodiments.

Still referring to FIG. 3, various dielectric layers 210, 212, and 214 are disposed over the metal layer 204. In an embodiment, the dielectric layer 210 may include one or more dielectric materials such as $Si_3N_4$, SiON, SiC, SiCN, or a combination thereof, and may be deposited using PVD, CVD, ALD, or other suitable processes to a thickness in a range of about 12 nm to about 20 nm. In an embodiment, the dielectric layer 212 includes a metal-based dielectric material, such as aluminum oxide, and may be deposited using CVD, ALD, or other suitable processes to a thickness in a range of about 2 nm to about 6 nm. In an embodiment, the dielectric layer 214 includes a silicon oxide based dielectric material such as un-doped silicate glass (USG), and may be deposited using CVD, PVD, or other suitable processes to a thickness in a range of about 40 nm to about 100 nm. Via holes 216 are formed into the dielectric layers 214, 212, and 210 to expose top surface of the metal lines 208 and the IMD layer 206. The via holes 216 may be formed using a variety of processes including photolithography processes and etching processes. For example, a photolithography process may be used to form an etch mask, the dielectric layers 214, 212, and 210 are etched through the etch mask to form the via holes 216, and the etch mask is removed thereafter.

Figure 4:
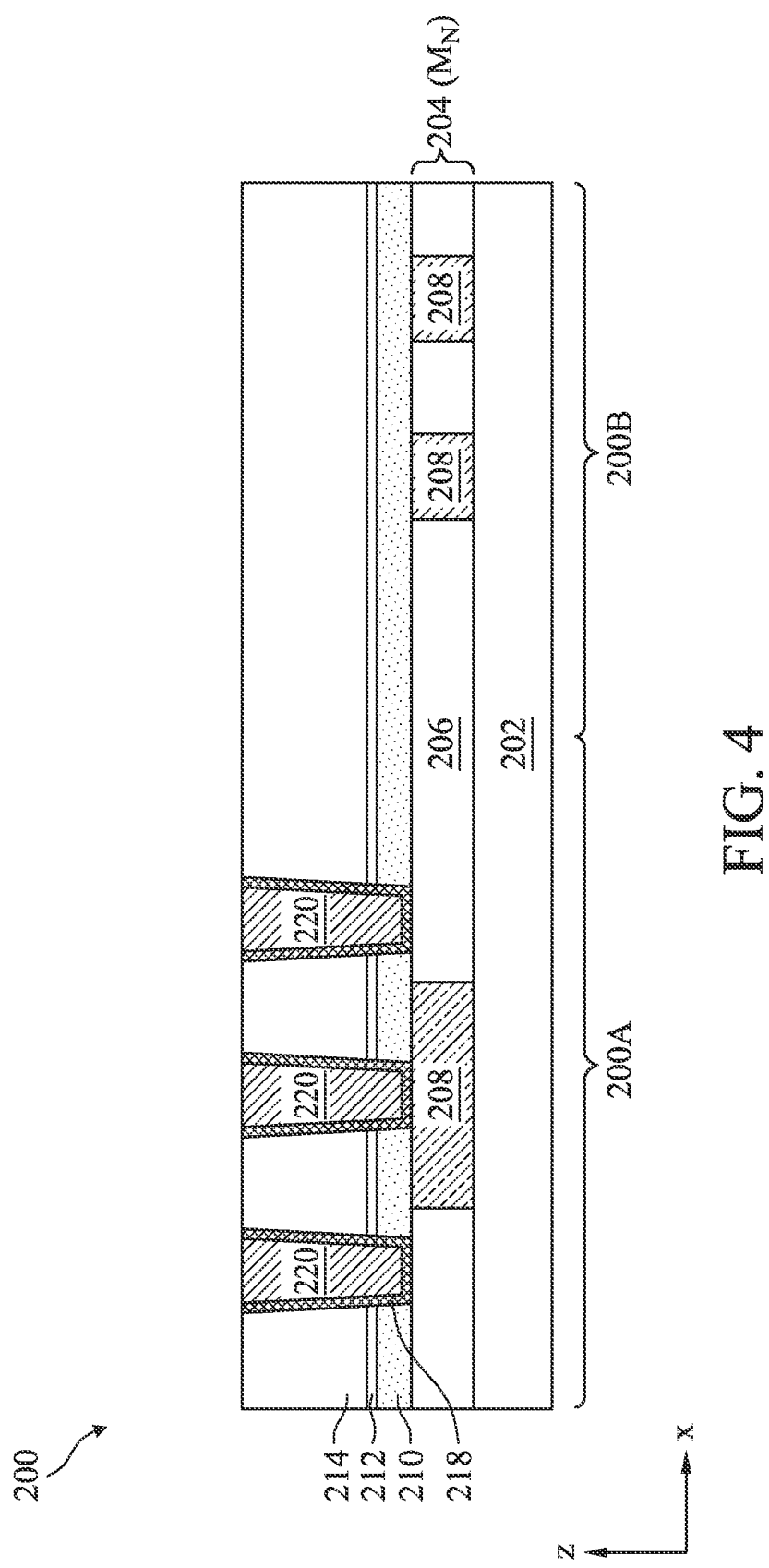

At operation 104, the method 100 (FIG. 2A) forms bottom electrode via (BEVA) 220 and barrier layer 218 in the via holes 216 and electrically connected to some of the metal lines 208 in the MRAM region 200A, such as shown in FIG. 4. For example, the operation 104 deposits the barrier layer 218 on the surfaces of the via holes 216 and deposits the BEVA 220 over the barrier layer 218. Thereafter, the operation 104 may perform a chemical mechanical planarization (CMP) process to the BEVA 220 and the barrier layer 218, thereby removing any excessive materials on the top surface of the dielectric layer 214. The barrier layer 218 may include a magnetic material such as Co or a non-magnetic material such as titanium nitride, tantalum nitride, or other suitable conductive diffusion barrier, and may be deposited using ALD, PVD, CVD, or other suitable deposition methods. The BEVA 220 may include a magnetic material such as Co or a non-magnetic material such as tungsten, titanium, tantalum, tungsten nitride, titanium nitride, tantalum nitride, a combination thereof, or other suitable metal or metal compound, and may be deposited using CVD, PVD, ALD, plating, or other suitable deposition methods.

Figure 5:
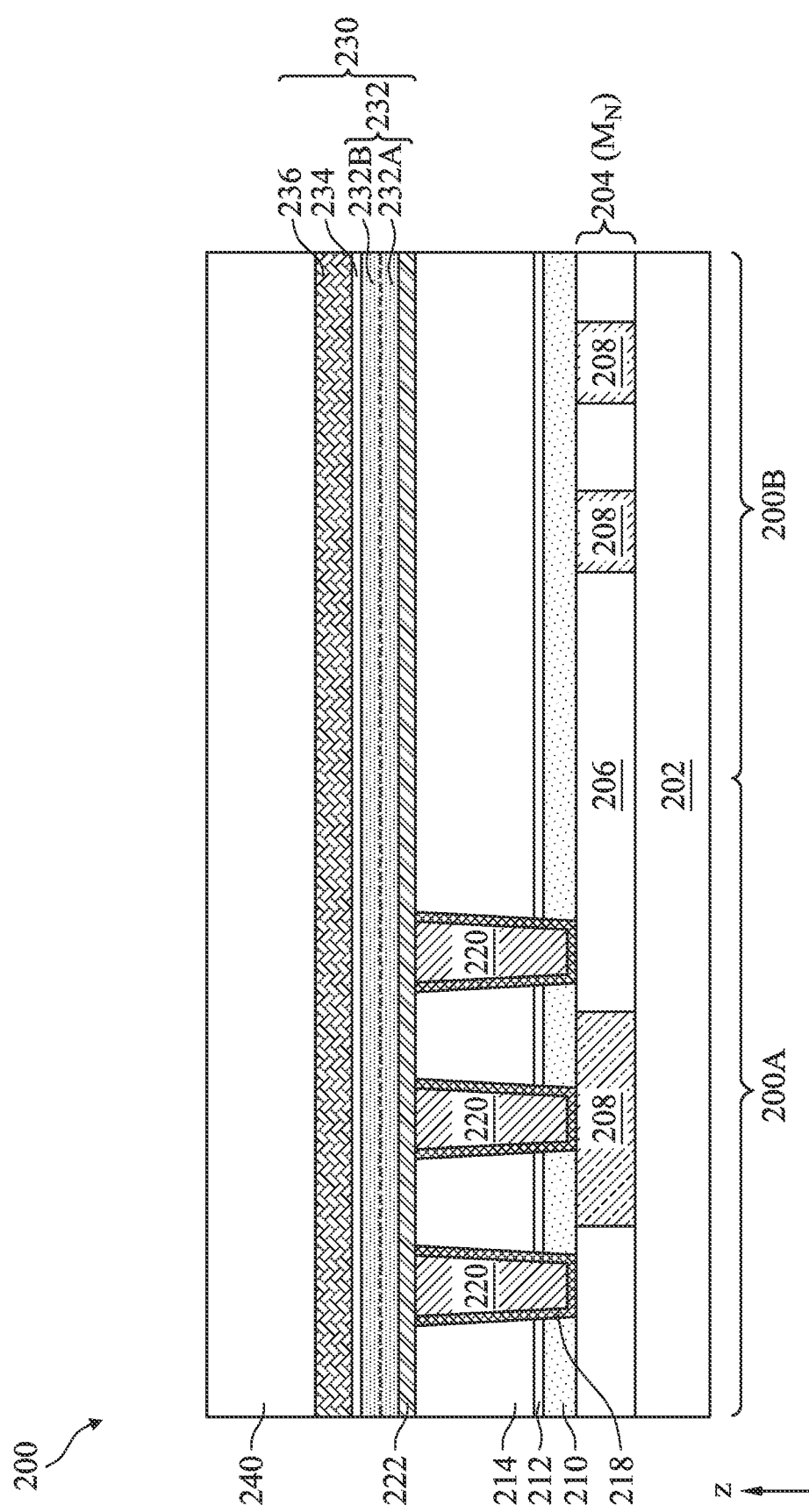

At operation 106, the method 100 (FIG. 2A) deposits a bottom electrode layer 222, an MTJ stack 230, and a top electrode layer 240 over the dielectric layer 214, the barrier layer 218, and the BEVA 220, such as shown in FIG. 5. Particularly, the bottom electrode layer 222 electrically connects to the BEVA 220. In accordance with some embodiments of the present disclosure, the bottom electrode layer 222 is formed as a blanket layer, and may be formed using CVD, Physical Vapor Deposition (PVD), Electro-Chemical Plating (ECP), Electroless plating, or other suitable deposition methods. The material of the bottom electrode layer 222 may include Cu, Al, Ti, Ta, W, Pt, Ni, Cr, Ru, TiN, TaN, combinations thereof, and/or multi-layers thereof. For example, bottom electrode layer 222 may include a titanium layer and a copper layer over the titanium layer. The bottom electrode layer 222 may be formed to have a thickness in a range about 1 nm to about 8 nm in some embodiments.

Over the bottom electrode layer 222, the MTJ stack 230 is formed. In accordance with some embodiments of the present disclosure, the MTJ stack 230 includes a bottom magnetic layer 232, a tunnel barrier layer 234 over the bottom magnetic layer 232, and a top magnetic layer 236 over tunnel barrier layer 234. The bottom magnetic layer 232 may include a pinning layer 232A and a pinned layer 232B (also referred to as a reference layer) over and contacting the pinning layer 232A. The top magnetic layer 236 may include a free layer. The neighboring layers in layers 232, 234, and 236 may also be in physical contact with each other. The bottom magnetic layer 232, the tunnel barrier layer 234, and the top magnetic layer 236 may be deposited using one or more deposition methods such as, CVD, PVD, ALD, or other suitable deposition methods. The MTJ stack 230 may have a thickness in a range of about 20 nm to about 50 nm in some embodiments.

The pinning layer 232A may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, the pinning layer 282A may be formed of PtMn, IrMn, RhMn, NiMn, PdPtMn, FeMn, Os, Mn, or the like. The pinned layer 232B may be formed of a ferromagnetic material with a greater coercivity field than the top magnetic layer 236, and may be formed of materials such as cobalt iron (CoFe), cobalt iron boron (CoFeB), or the like. In accordance with some embodiment, the pinned layer 232B has a synthetic ferromagnetic (SFM) structure, in which the coupling between magnetic layers is ferromagnetic coupling. The bottom magnetic layer 232 may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the bottom magnetic layer 232 may have a Co layer and repeated $(Pt/Co)_x$ layers over the Co layer, with x representing repeating number and may be any integer equal to or greater than 1.

The tunnel barrier layer 234 may be formed of a metal oxide that is one of MgO, TiOx, AlTiO, MgZnO, $Al_2O_3$, ZnO, ZrOx, HfOx, or MgTaO. In one embodiment, MgO is selected as the tunnel barrier layer because it provides the highest magnetoresistive ratio, especially when sandwiched between two CoFeB layers, for example. The tunnel barrier layer 234 may have a thickness in a range of about 0.5 nm and about 3 nm.

The top magnetic layer 236 may be formed of a ferromagnetic material such as CoFe, NiFe, CoFeB, CoFeBW, or the like. The top magnetic layer 236 may also adopt a synthetic ferromagnetic structure, which is similar to the SAF structure, with the thickness of the tunnel barrier layer 234 adjusted to achieve the ferromagnetic coupling between the separated magnetic metals, i.e, causing the magnetic moment to be coupled in the same direction. The magnetic moment of the top magnetic layer 236 is programmable, and the resistance of the resulting MTJ is accordingly changed between a high resistance and a low resistance. It is realized that the materials and the structure of the MTJ stack 230 may have many variations, which are also within the scope of the present disclosure. For example, layers 232A, 232B, 234, and 236 may be formed in an order inversed from what is shown in FIG. 5. Accordingly, the free layer may be the bottom layer of the MTJ stack 230, while the pinning layer may be the top layer.

The top electrode layer 240 is formed over the MTJ stack 230. In accordance with some embodiments of the present disclosure, the top electrode layer 240 is formed as a blanket layer, and may be formed using CVD, PVD, ECP, electroless plating, or other suitable deposition methods. The material of the top electrode layer 240 may include aluminum, titanium, tantalum, tungsten, or the like, alloys thereof, and/or multi-layers thereof. The Top electrode layer 240 may be used as a hard mask in the subsequent patterning of MTJ layer, and may include a conductive layer formed of TiN, Ta, TaN, Ti, Ru, W, Si, alloys thereof, and/or multi-layers thereof. The top electrode layer 240 may be formed to have a thickness in a range about 10 nm to about 80 nm in some embodiments.

Figure 6:
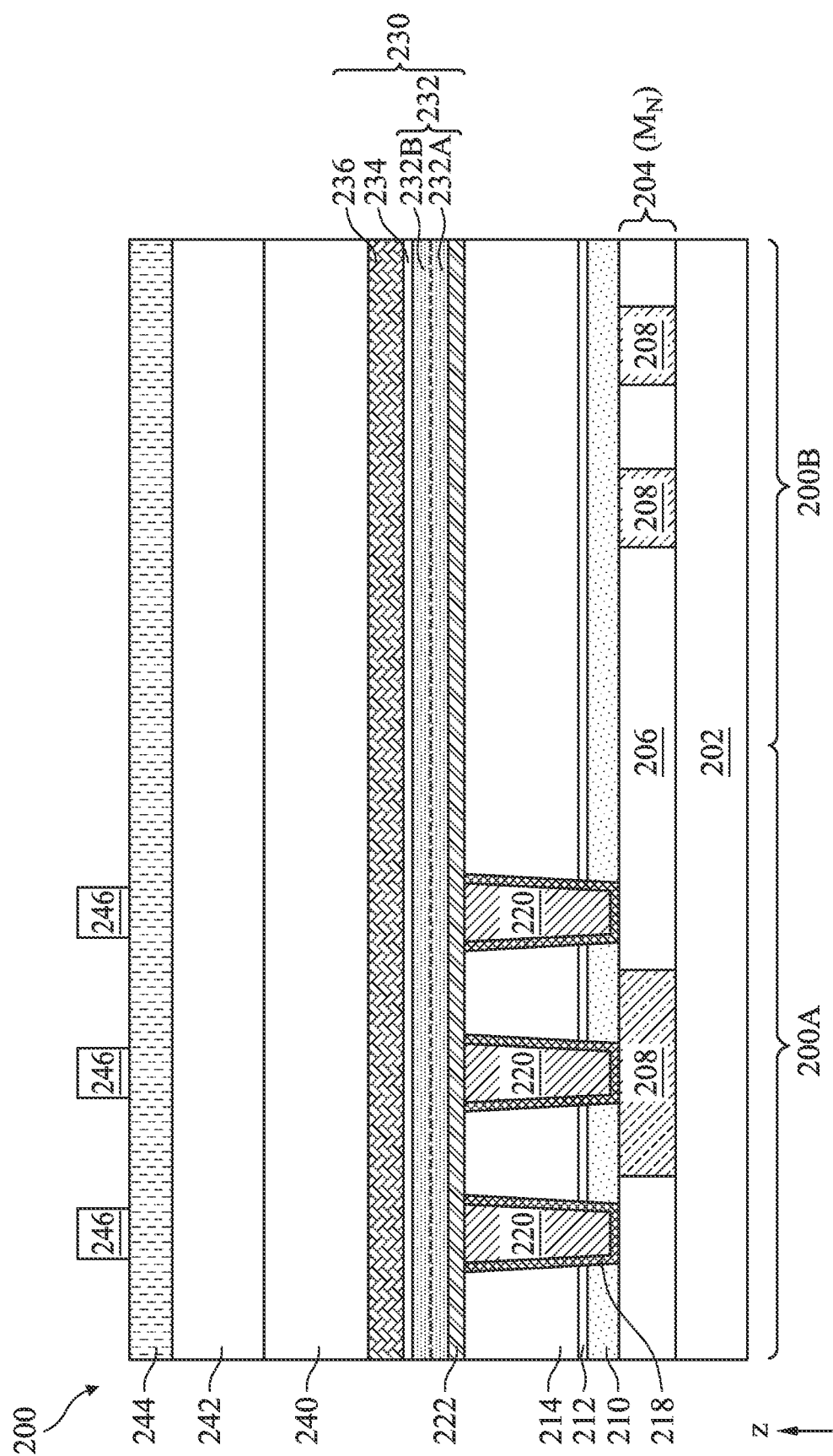

At operation 108, the method 100 (FIG. 2A) forms a tri-layer over the top electrode layer 240 and patterns the tri-layer and the top electrode layer 240. The tri-layer includes a bottom layer 242, a middle layer 244 over the bottom layer 242, and a top layer 246 over the middle layer 244, such as shown in FIG. 6. In accordance with some embodiments of the present disclosure, the bottom layer 242 may be cross-linked, and hence is different from typical photo resists used for light exposure. The bottom layer 242 may function as a bottom anti-reflective coating (BARC) when the top layer 246 is light-exposed. The middle layer 244 may be formed of a material including silicon and oxygen, which may be SiON, for example, while other similar materials may be used. The top layer 246 is formed of a photo resist. The top layer 246 is coated as a blanket layer, and is then patterned in a photo lithography process using a photo lithography mask. In a top view of the semiconductor device 200, the remaining portions of the top layer 246 may be arranged as an array.

Figure 7:
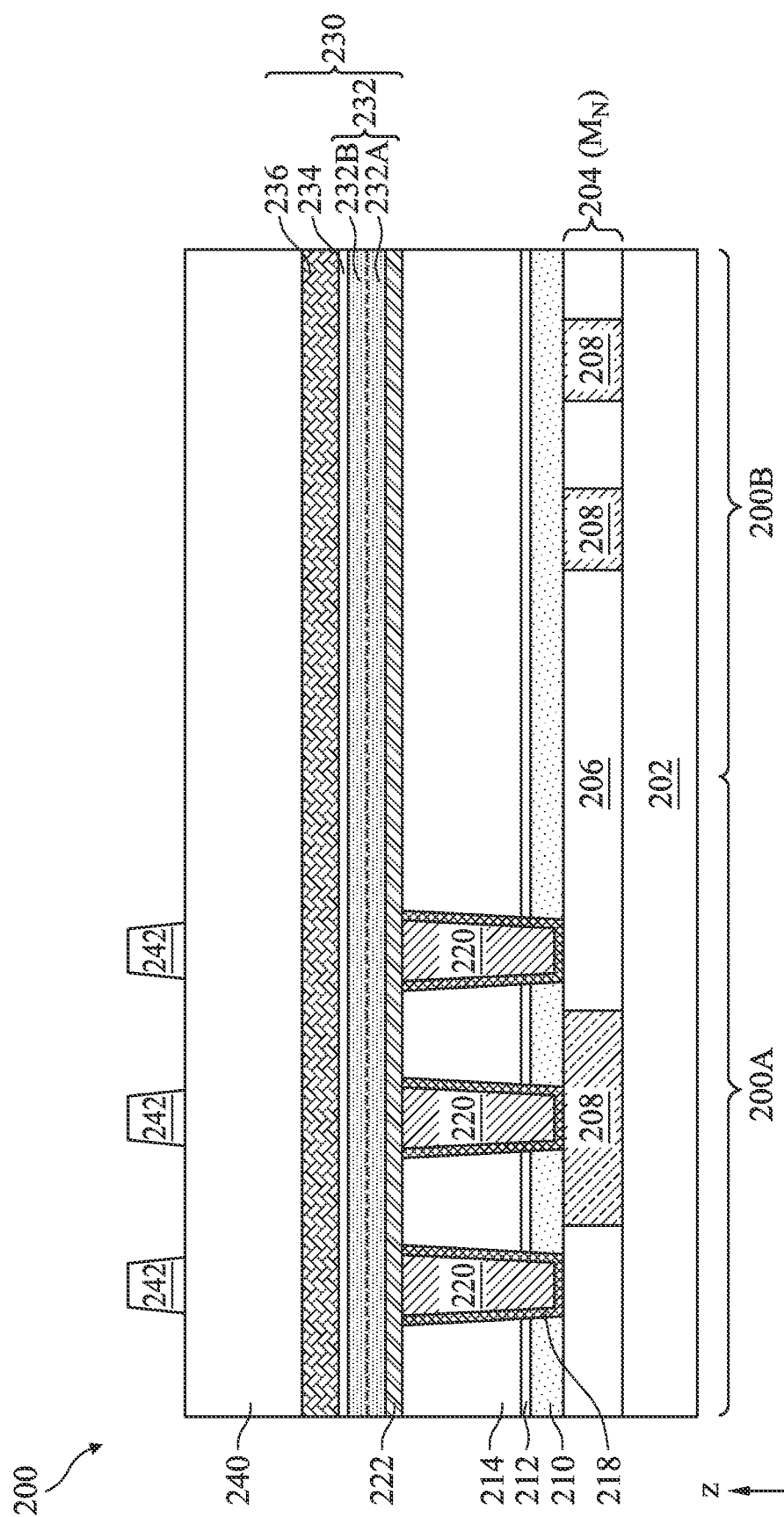
Figure 8:
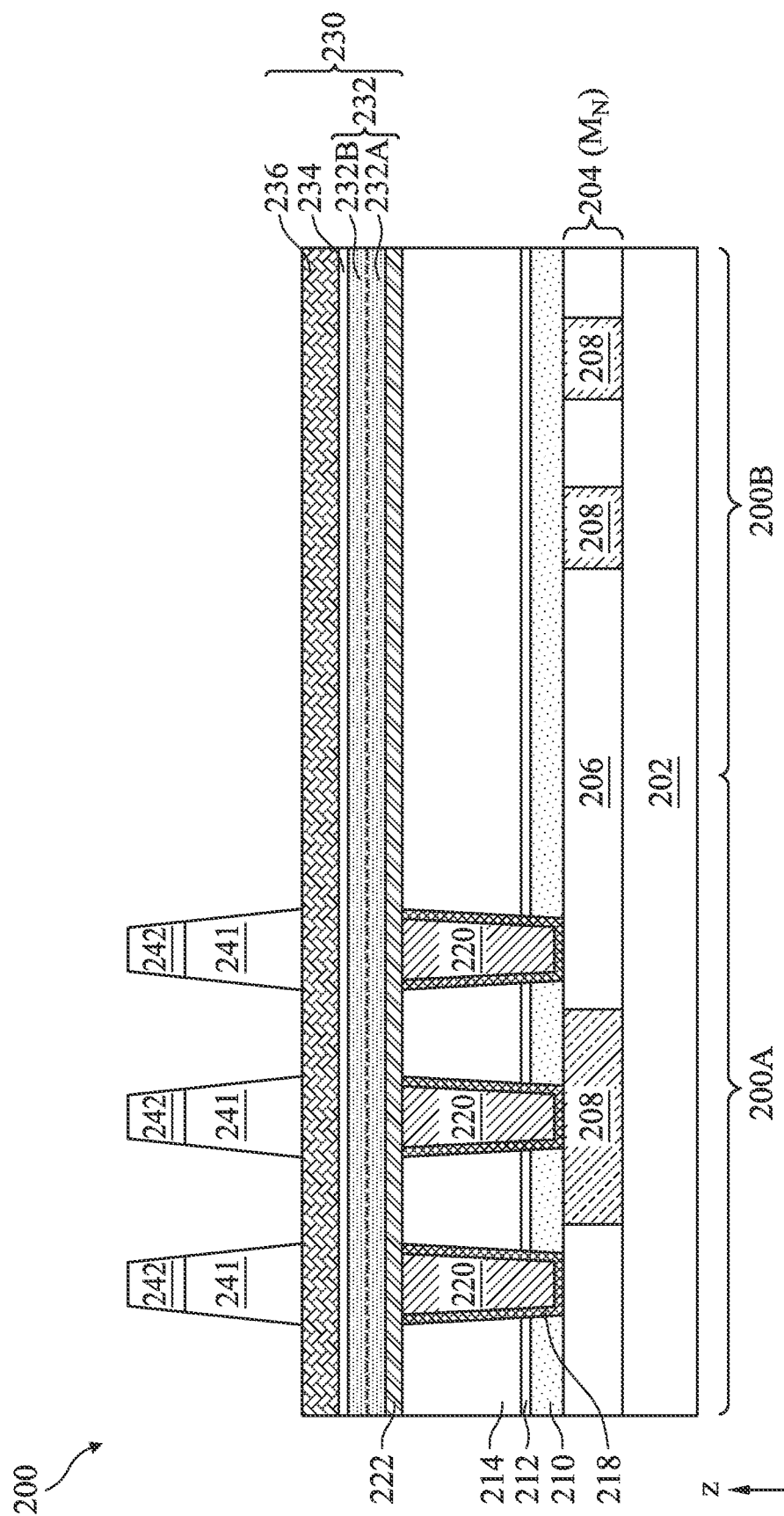

In subsequent steps at operation 108, the patterned top layer 246 is used as an etch mask to etch and pattern the underlying middle layer 244 and the bottom layer 242. The patterned top layer 246 and middle layer 244 may be consumed in the etch process or removed thereafter, using etching, stripping, ashing, or other suitable methods, such as shown in FIG. 7. In a subsequent step, the patterned bottom layer 242 is used as an etch mask to etch the underlying top electrode layer 240, forming top electrodes. The top electrodes are denoted as top electrodes 241, such as shown in FIG. 8. The etching method may include a plasma etching method, such as a reactive ion etching (RIE) process. After the etching process, the remaining portions of the bottom layer 242 is removed.

Still referring to FIG. 8, after the top electrodes 241 are formed, the MTJ stack 230 is subsequently patterned in an etch process with the top electrodes 241 as an etch mask. Generally, a single step etch process patterns the entire MTJ stack 230 into individual MTJs. Ion beam etching (IBE) is often used in this etch process in patterning the MTJ stack 230 over reactive ion etching (RIE), due to IBE's physical bombardment nature without introducing chemical impurities into the MTJs which requires high material purities. Although IBE produces no chemical damage and leaves minimal plasma damage compared to RIE, it often leads to a high degree of redeposited material on MTJ sidewalls. When metal particles, such as Ti or Ta, are redeposited on the tunnel barrier layer 234, shorting may easily occur and render the device unusable. Moreover, damaged sidewalls are difficult to repair and often lead to reduced yield and therefore higher cost per unit of acceptable product. As will be discussed below, the method 100 will perform a two-step etch process that patterns the top and bottom magnetic layers in the MTJ stack 230 separately. A dielectric spacer will be deposited after the first step of the etch process for capping sidewalls of the patterned top magnetic layer. The dielectric spacer electrically isolates the patterned top magnetic layer from redeposited metal particles created in the second step of the etch process.

Figure 9:
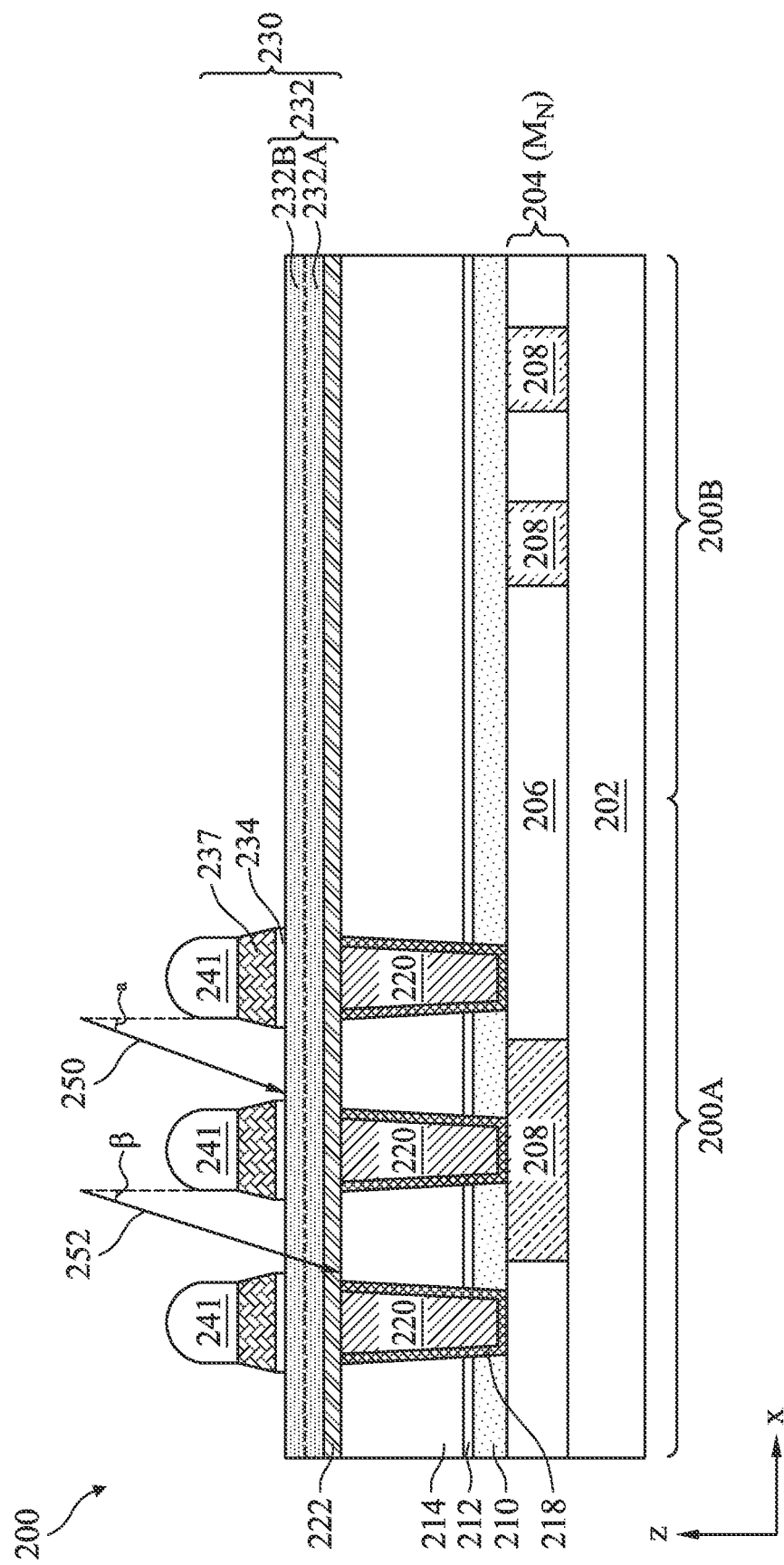

At operation 110, the method 100 (FIG. 2A) patterns the top magnetic layer 236 into an array of top magnetic plates (denoted as top magnetic plates 237), such as shown in FIG. 9. In the illustrated embodiment, the tunnel barrier layer 234 is also etched, exposing a top surface of the bottom magnetic layer 232. The etch step may be an IBE with a time mode control or an end mode control to stop at the top surface of the bottom magnetic layer 232. This is the first step of the two-step etch process. The IBE may use one or more noble gas ions such as Ar, Kr, Xe, and Ne generated with an RF or DC power directed at a certain penetration angle α towards the top surface of the semiconductor 200. It should be understood that IBE typically comprises rotating the work piece (wafer) on which the MTJ stack of layers is formed. Moreover, since the initial etch step only needs the noble gas ions to reach a top surface of the bottom magnetic layer 232 (e.g., along trace 250), it allows a larger penetration angle α compared with a penetration angle β, which is for noble gas ions along trace 252 to etch the entire MTJ stack 230 in a single etch step (i.e., α>β). In some embodiments, the maximum penetration angle β has to be limited within 45°, while the maximum penetration angle α can be expanded to be larger than 50°. A penetration angle larger than 50° allows etching byproducts to more sufficiently escape from trenches formed between MTJs, therefore, reducing amount of impurities trapped in the MRAM array, which in turn reduces MTJ bit error rate (BER).

Figure 10:
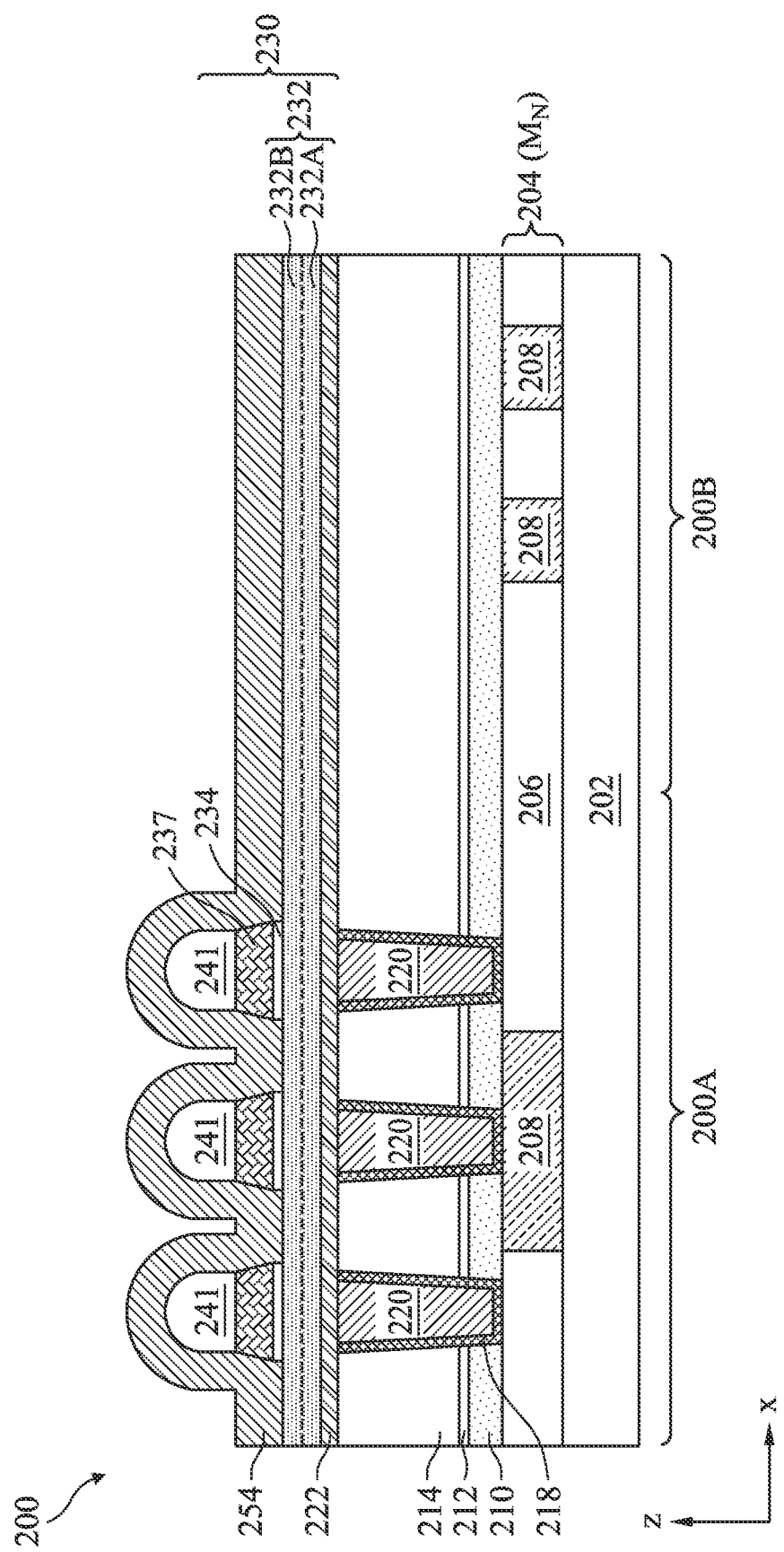

At operation 112, the method 100 (FIG. 2A) deposits a dielectric spacer layer 254 over the sidewalls of the top electrodes 241, the top magnetic plates 237, and the tunnel barrier layer 234 and also over the exposed top surface of the bottom magnetic layer 232. For example, the operation 112 may deposit a blanket dielectric layer over the semiconductor device 200 in both the MRAM region 200A and the logic region 200B using CVD, ALD, or other suitable methods, such as shown in FIG. 10. The spacer layer 254 may include one or more dielectric materials such as silicon oxide, silicon nitride, silicon oxynitride, or the like. The spacer layer 254 may include one or multiple layers of the dielectric materials in various embodiments.

Figure 11:
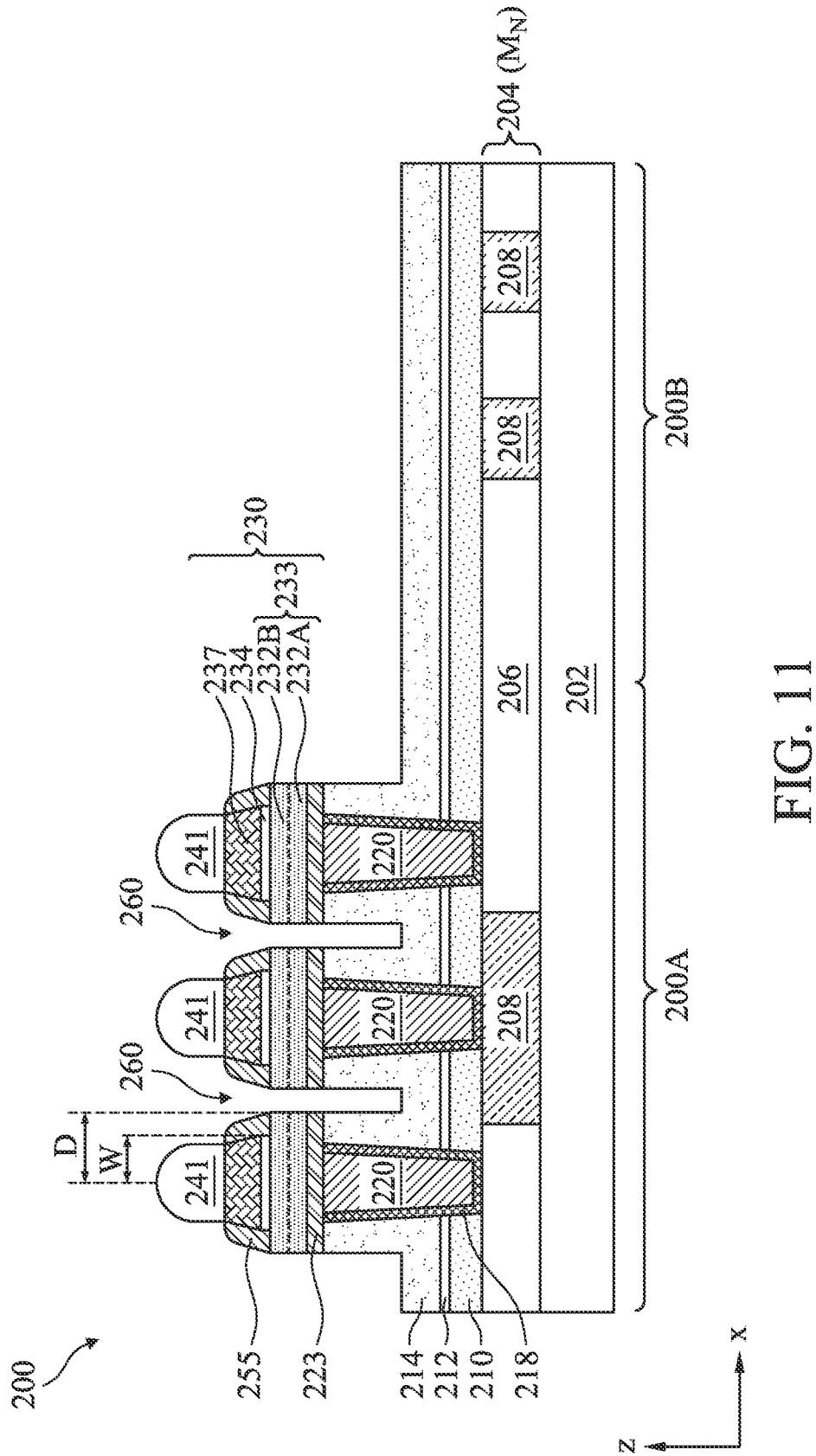

At operation 114, the method 100 (FIG. 2A) patterns the bottom magnetic layer 232 and the bottom electrode layer 222 into an array of bottom magnetic plates (denoted as bottom magnetic plates 233) and bottom electrodes (denoted as bottom electrodes 223), thereby forming the array of MTJs 230, such as shown in FIG. 11. The etch step may be an RIE etch, which is the second step of the two-step etch process. The RIE anisotropically etches the blank spacer layer 254, the bottom magnetic layer 232, the bottom electrode layer 222, and the dielectric layer 214 with a time mode control to form trenches 260 between adjacent MTJs without etching through the dielectric layer 214. Top portions of the spacer layer 254 is removed, exposing the top electrodes 241. Portions of the spacer layer 254 remain on sidewalls of the MTJs, becoming the spacer 255. During the RIE etch, metal particles, such as Ti or Ta, redeposit on outer sidewalls of the spacer 255 but not on sidewalls of the top magnetic plates 237 and the tunnel barrier layer 234, thus without causing shorting between the top and bottom magnetic plates. In an alternative embodiment, the second step etch may employs an IBE etch instead of an RIE etch. In yet another embodiment, the second step etch includes an RIE etch that anisotropically etches the spacer layer 254 to form the spacer 255 and a subsequent IBE etch to pattern the bottom magnetic layer 232, the bottom electrode layer 222, and the dielectric layer 214. At the conclusion of operation 114, the array of MRAM cells is formed in the MRAM region 200A.

Figure 20:
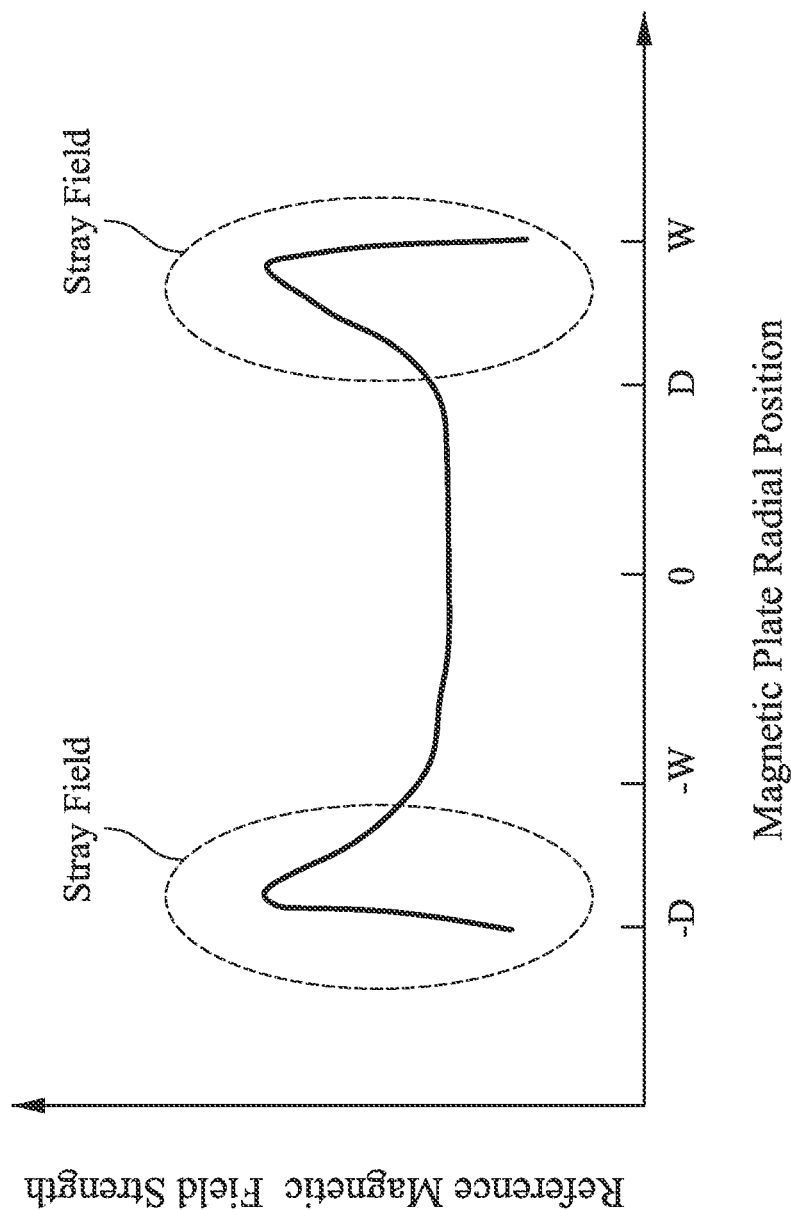
FIG. 20 illustrates reference magnetic field strength with respect to magnetic plate radial position, in accordance with some embodiments.

Still referring to FIG. 11, in an MTJ, the top magnetic plate 237 has an edge-to-center distance (e.g., a radius for a plate) denoted as W and the bottom magnetic plate 233 has an edge-to-center distance (e.g., a radius for a plate) denoted as D that is larger than W (D>W). In some embodiments, W ranges from about 15 nm to about 25 nm and radius D ranges from about 17 nm to about 30 nm. As illustrated in FIG. 20, by pushing edges of the bottom magnetic plate 233 away from edges of the top magnetic plate 237, the magnetic stray field that generally focuses at edges of a magnetic reference layer (e.g., layer 232B) is further away from a free layer (e.g., plate 237), allowing the free layer references to a more uniform magnetic field in a center region of the magnetic reference layer, which in turn increases MTJ accuracy. In some embodiments, a ratio between D and W ranges from about 1.1:1 to about 1.5:1. This range provides a good compromise of effective uniform magnetic field for reference and acceptable device sizes, such that when the ratio is smaller than 1.1:1 stray field disturbs accuracy of an MTJ and when the ratio is larger than 1.5:1 the dimensions of a single MRAM cell becomes too large for a cost efficiency.

Figure 12:
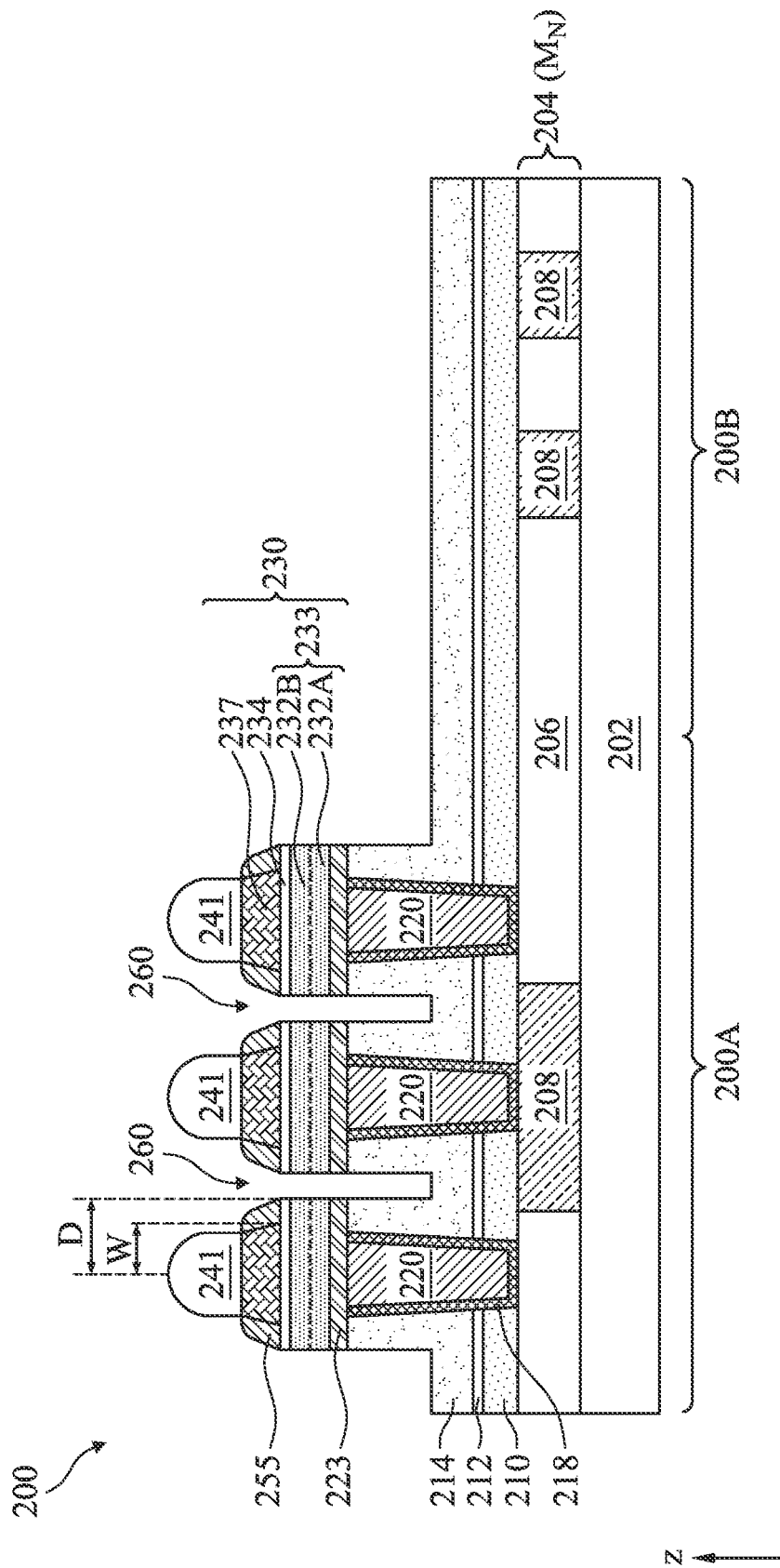

FIG. 12 illustrates an alternative embodiment of the semiconductor device 200 at the conclusion of operation 114. In this embodiment, the first step etch stops at the top surface of the tunnel barrier layer 234. The tunnel barrier layer 234 is patterned together with the bottom magnetic layer 232 in the second step etch. Accordingly, the tunnel barrier layer 234 extends out of sidewalls of the top magnetic plate 237 and the spacer 255 is deposited on the extended portions of the tunnel barrier layer 234.

Figure 13:
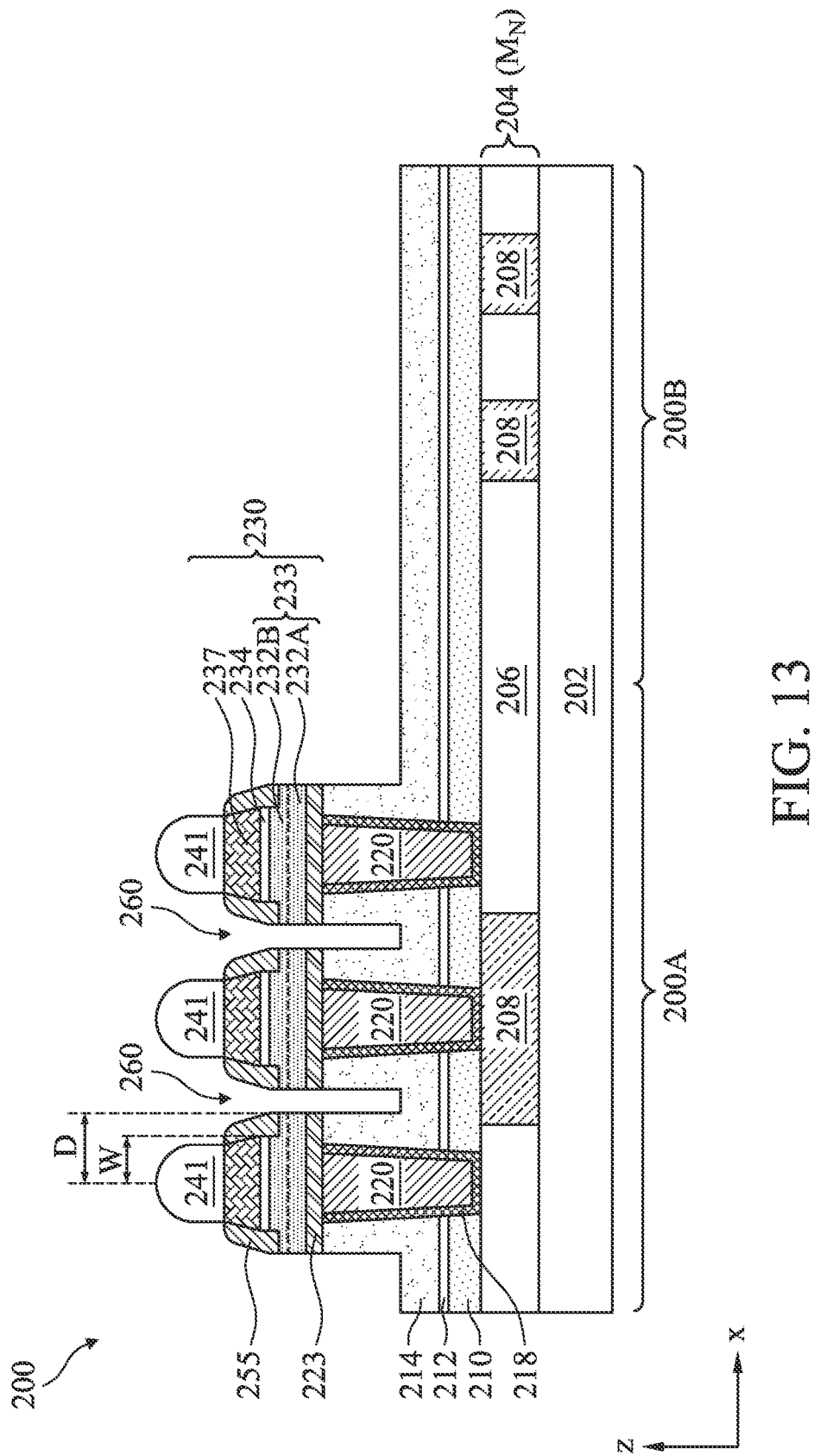

FIG. 13 illustrates another alternative embodiment of the semiconductor device 200 at the conclusion of operation 114. In this embodiment, the first step etch patterns the tunnel barrier layer 234 but also over etches the top surface of the pinned layer 232B. Consequently, portions of the pinned layer 232B directly under the spacer 255 is thinner than other portions directly under the tunnel barrier layer 234. The over etch allows a top portion of the sidewalls of the pinned layer 232B is also covered by the spacer 255, which further reduces negative impacts from metal particle redeposition.

Figure 14:
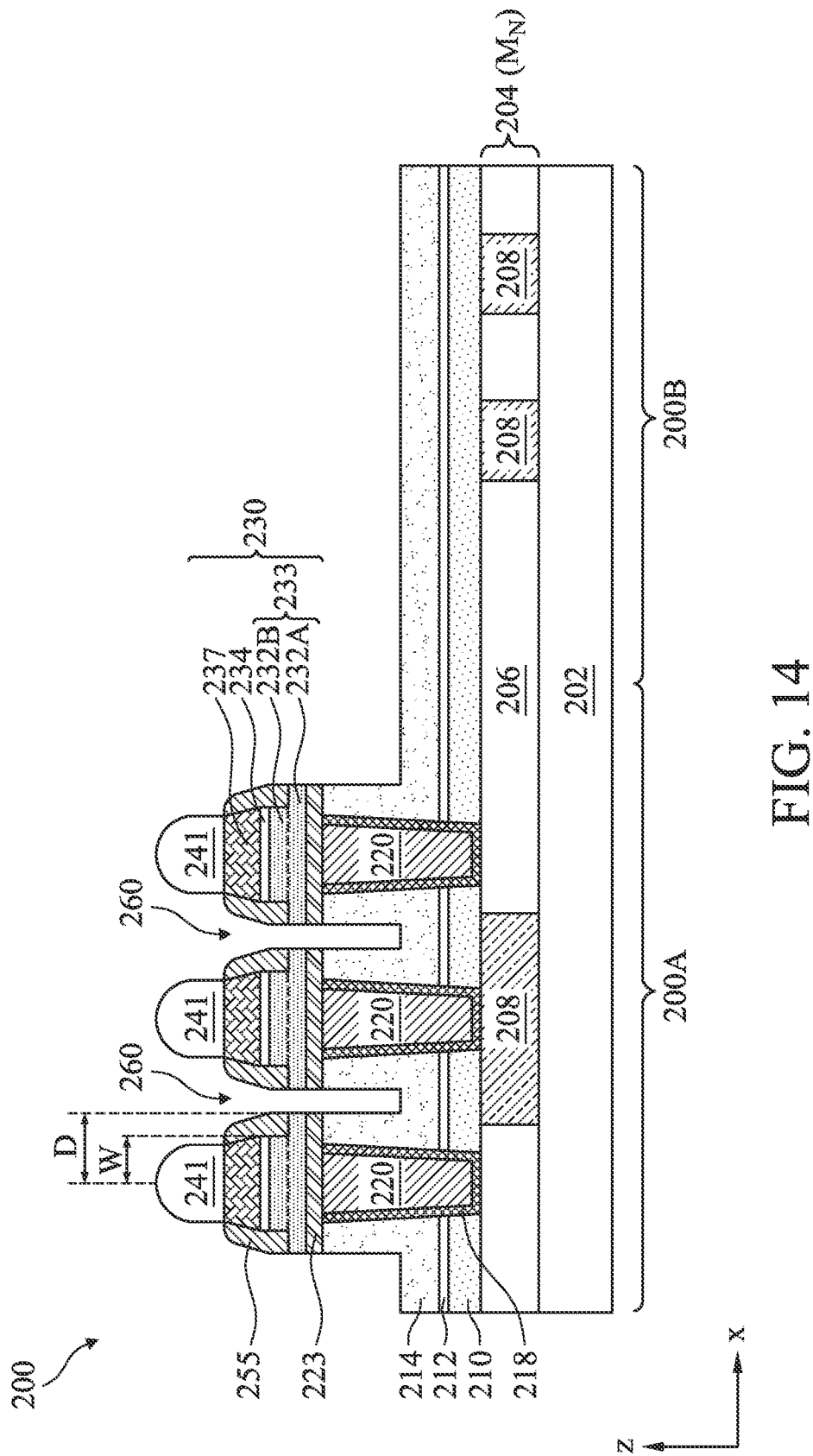

FIG. 14 illustrates yet another alternative embodiment of the semiconductor device 200 at the conclusion of operation 114. In this embodiment, the first step etch patterns the tunnel barrier layer 234 and also patterns the pinned layer 232B. Consequently, the top surface of the pinning layer 232A is exposed and extends out of sidewalls of the pinned layer 232B, and the spacer 255 is deposited on the extended portions of the pinning layer 232A. By having sidewalls of the pinned layer 232B fully cover by the spacer 255, the negative impact from metal particle redeposition during patterning bottom portions of an MTJ can be reduced.

Figure 15:
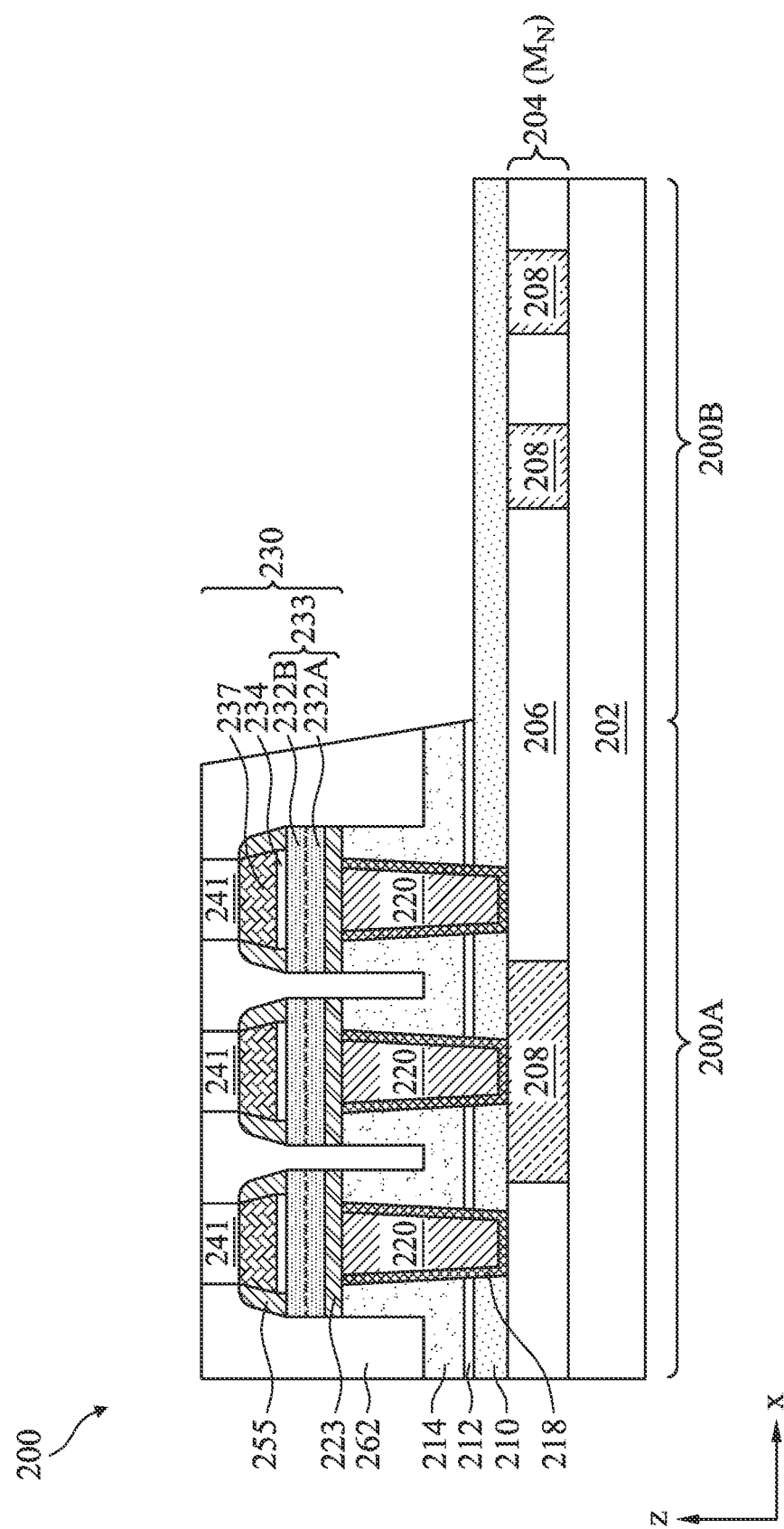

In FIG. 15 and the following figures, the manufacturing operations after the structure shown in FIG. 11 is formed are explained. However, the same operations can be applied to the alternative embodiments as shown in FIGS. 12-14.

Figure 16:
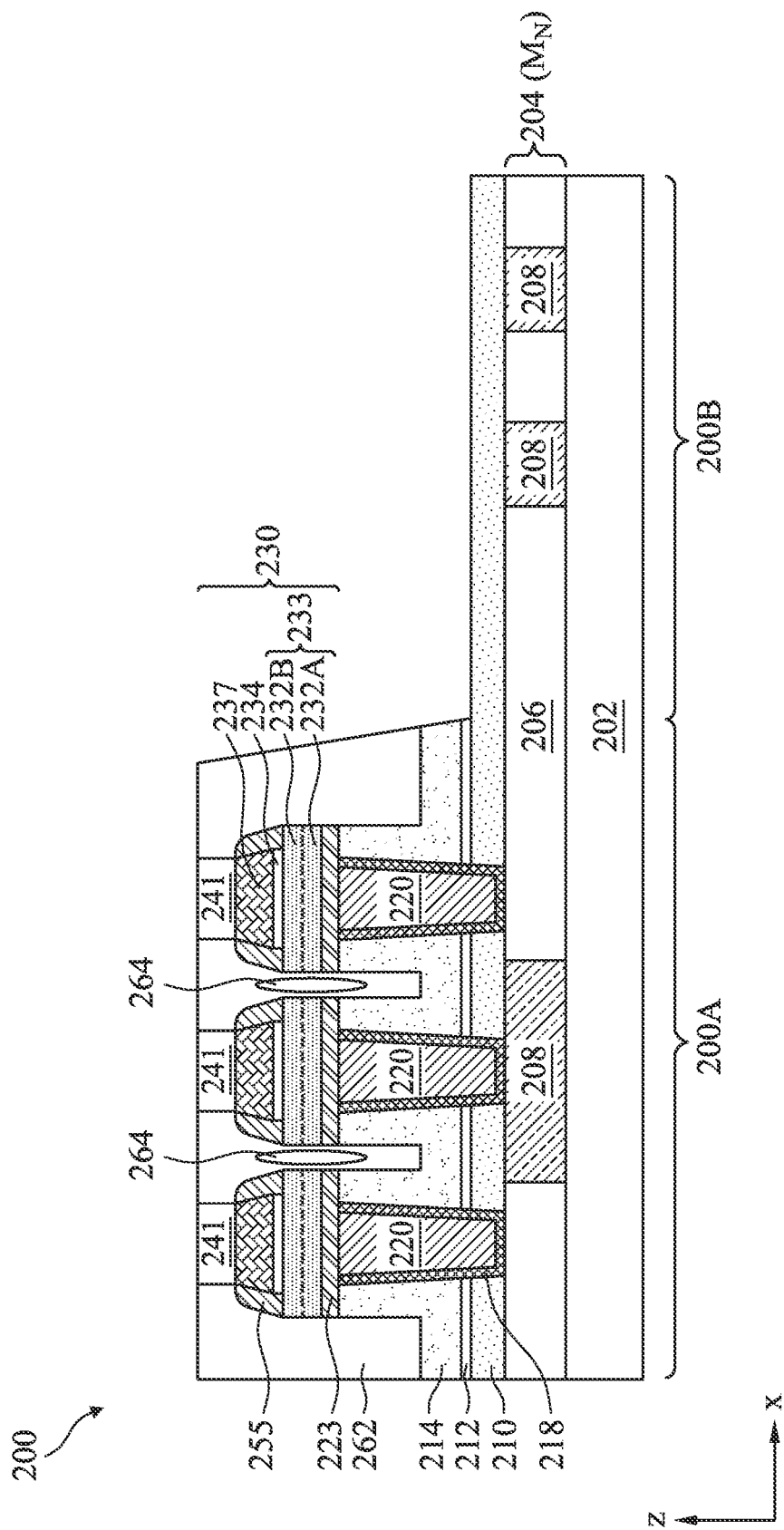

At operation 116, the method 100 (FIG. 2B) forms a dielectric layer 262 in the MRAM region 200A, such as shown in FIG. 15. For example, the operation 116 may deposit the dielectric layer 262 in both the MRAM region 200A and the logic region 200B; form an etch mask using photolithography and etching processes where the etch mask covers the MRAM region 200A and exposes the logic region 200B; etch the dielectric layers 262, 214, and 212 through the etch mask until the dielectric layer 210 is exposed in the logic region 200B; and remove the etch mask. The dielectric layer 262 may be deposited using CVD, PVD, or other suitable methods. The dielectric layers 262, 214, and 212 may be etched using wet etching, dry etching, reactive ion etching, or other suitable methods. The dielectric layer 262 fills the trenches 260 between adjacent MTJ cells 230. Redeposited metal particles, such as Ti and/or Ta, are trapped between outer sidewalls of the spacer 255 and the dielectric layer 262, but not on the sidewalls of the top magnetic plates 237 and the tunnel barrier layer 234. In some embodiments, due to the high aspect ratio of the trenches 260, voids (air gaps) 264 may be trapped in the trenches 260 by the dielectric layer 262, such as shown in FIG. 16. The voids 264 may extends vertically from a position next to spacer 255 to a position next to BEVA 220 in some embodiments. The voids 264 help reducing parasitic capacitance between adjacent MRAM cells and increases device speed.

Figure 17:
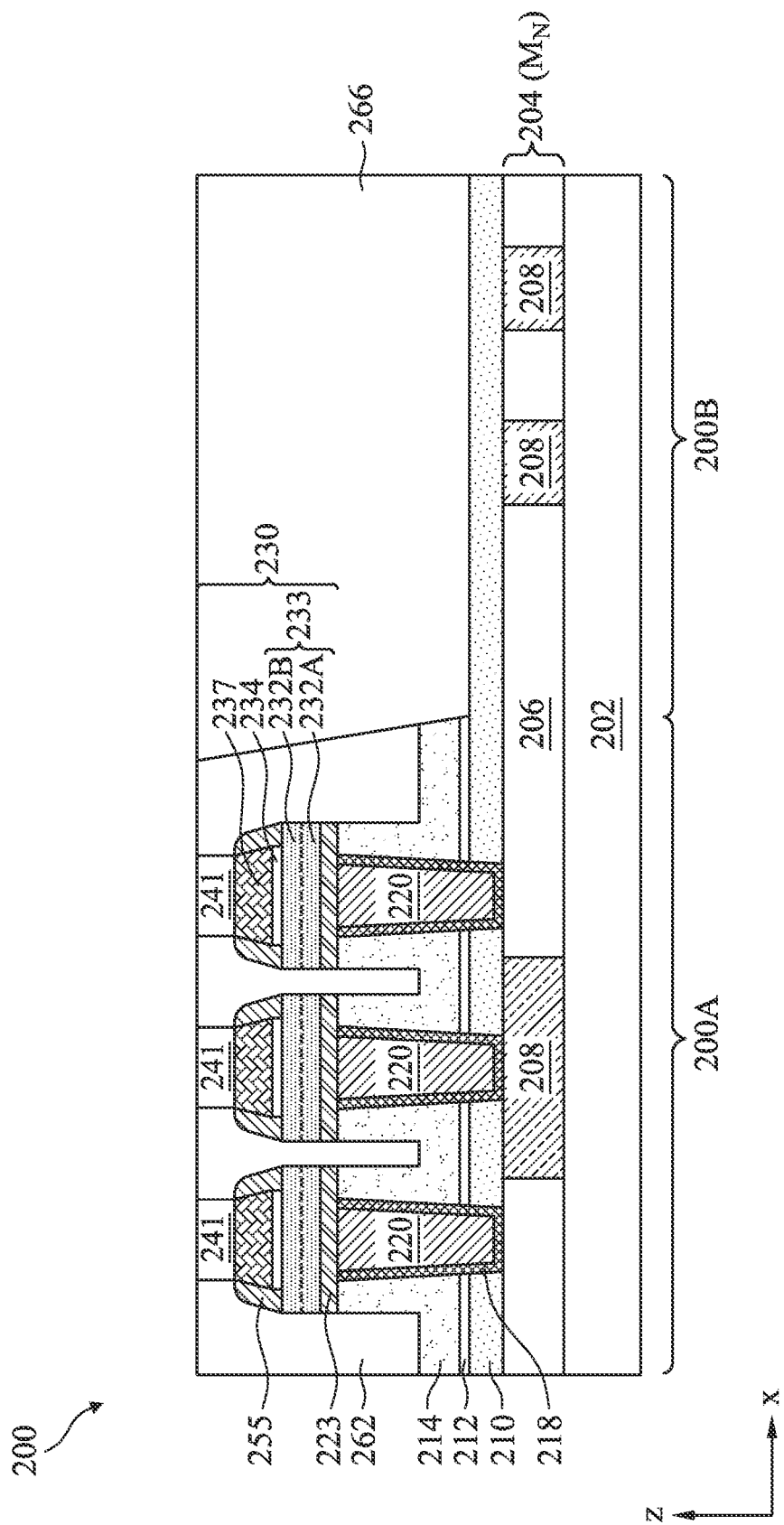

After the dielectric layers 262, 214, and 212 are etched, the operation 116 further forms a dielectric layer 266 in the logic region 200B, such as shown in FIG. 17. The dielectric layer 266 can be an oxide, such as silicon dioxide, a low-k dielectric material such as carbon doped oxides, or an extreme low-k dielectric material such as porous carbon doped silicon dioxide. The dielectric layer 266 may be deposited using CVD, PVD, or other suitable methods. The operation 116 further performs a CMP process to planarize the top surfaces of the dielectric layers 262 and 266, and the top electrodes 241.

Figure 18:
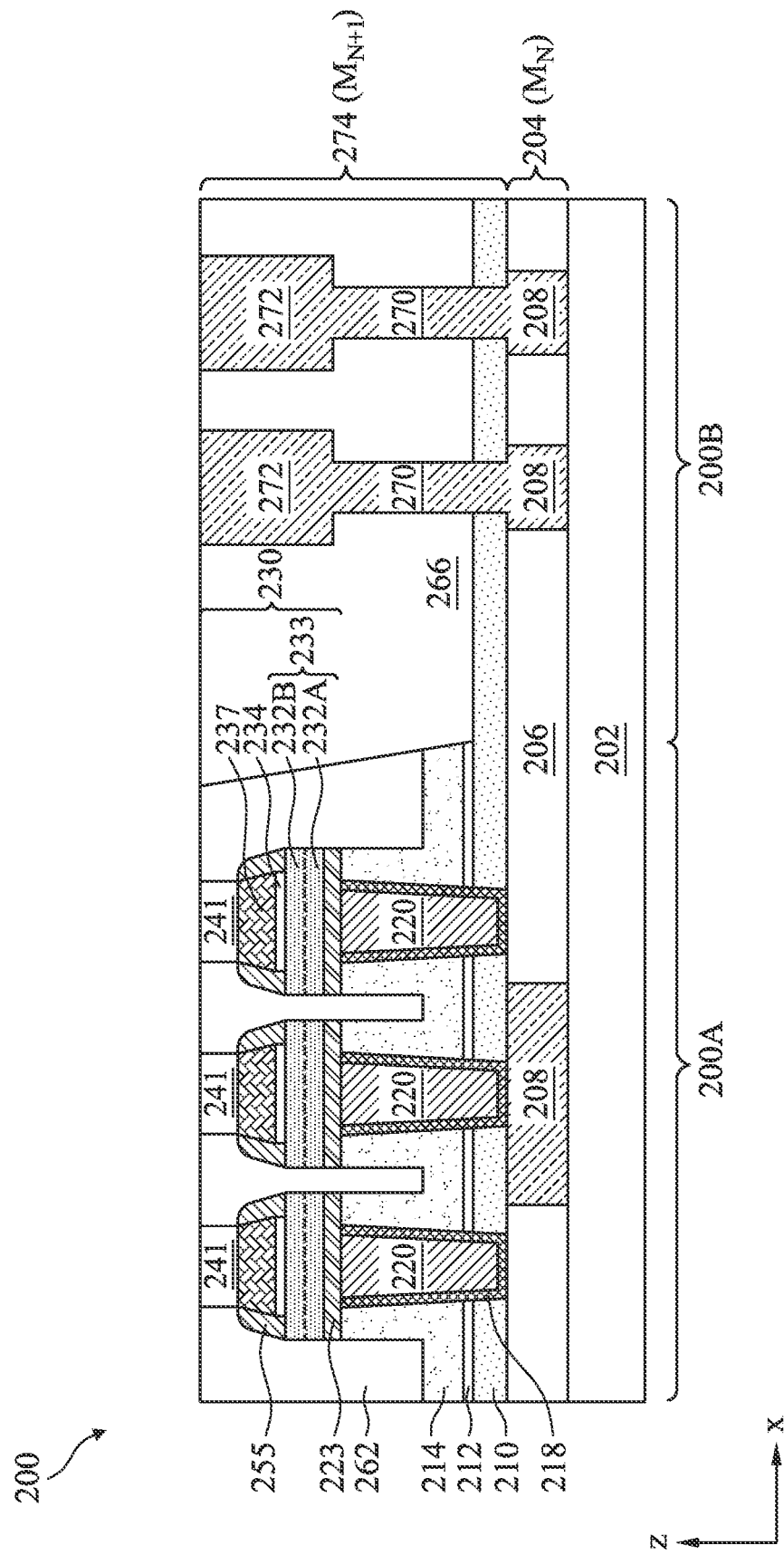

At operation 118, the method 100 (FIG. 2B) forms metal vias 270 and metal lines 272 in the logic region 200B, such as shown in FIG. 18. The metal vias 270 and metal lines 272 may be formed using damascene process, dual damascene process, or other suitable methods. For example, the operation 118 may etch holes and/or trenches in the dielectric layer 266 to expose the top surface of the metal lines 208, deposit one or more metals into the holes and/or trenches, and perform a CMP process to the one or more metals. Portions of the one or more metals remaining in the holes and/or trenches become the metal vias 270 and the metal lines 272. The metal vias 270 and the metal lines 272 may include aluminum, copper, or other suitable low resistance metals, and may be deposited using PVD, CVD, ALD, plating, or other suitable methods. At the conclusion of the operation 118, the top surface of the metal lines 272 are substantially coplanar with the top surface of the top electrodes 241. Through operations 116 and 118, the metal layer 274 as the (N+1)th metal layer (denoted as $M_{N+1}$) is formed over the Nth metal layer 204.

Figure 19:
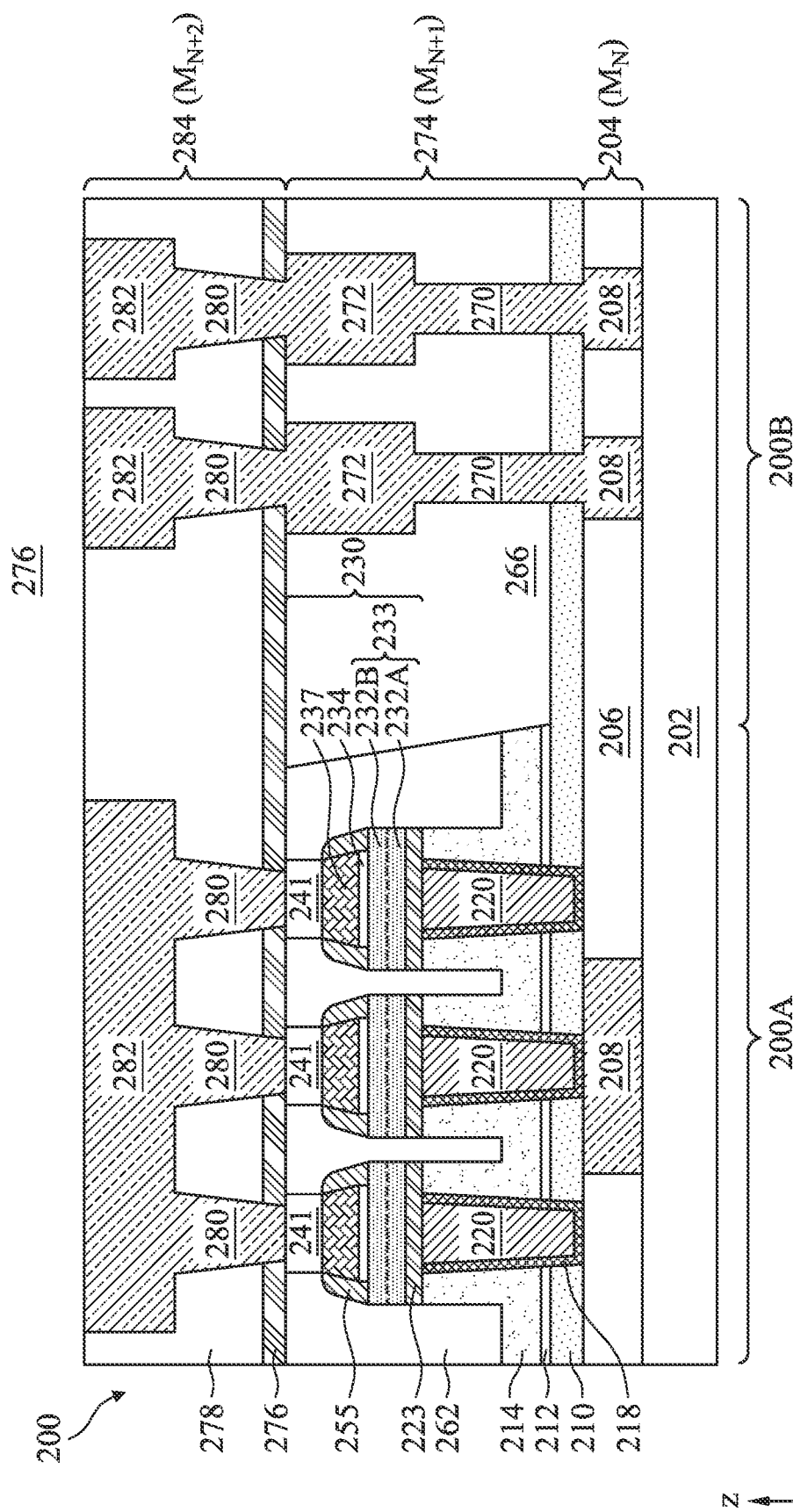

At operation 120, the method 100 (FIG. 2B) forms an etch stop layer 276 and an IMD layer 278 in the MRAM region 200A and the logic region 200B, such as shown in FIG. 19. Examples of dielectrics that may be suitable for the etch stop layer 276 include silicon nitride (SiN), silicon oxynitride (SiON), silicon oxycarbide (SiOC), and the like. The etch stop layer 276 may be deposited by CVD, PVD, ALD, or other suitable methods. The IMD layer 278 is formed over the etch stop layer 276. IMD layer 278 may be a low-k or extremely low-k dielectric formed by any suitable process. After the etch stop layer 276 and the IMD layer 278 are formed, the operation 120 further forms metal vias 280 and metal lines 282 in the MRAM region 200A and the logic region 200B. The metal vias 280 and the metal lines 282 may be formed using damascene process, dual damascene process, or other suitable methods. For example, the operation 120 may etch holes and/or trenches in the IMD layer 278 and the etch stop layer 276 to expose the top surface of the top electrodes 241 in the MRAM region 200A and the top surfaces of the metal lines 272 in the logic region 200B; deposit one or more metals into the holes and/or trenches; and perform a CMP process to the one or more metals. Portions of the one or more metals remaining in the holes and/or trenches become the metal vias 280 and the metal lines 282. The metal vias 280 and the metal lines 282 may include aluminum, copper, or other suitable low resistance metals, and may be deposited using PVD, CVD, ALD, plating, or other suitable methods. The metal lines 282 in the MRAM region 200A functions as the bit lines (e.g., $BL_1$-$BL_N$ in FIG. 1B) for the array of MRAM cells. At the conclusion of the operation 120, the metal layer 284 as the (N+2)th metal layer (denoted as $MN_{+2}$) is formed over the (N+1)th metal layer 274.

At operation 122, the method 100 (FIG. 2B) performs further fabrication to the semiconductor device 200, such as forming one or more metal layers over the metal layer 284, forming passivation layer(s), and performing more back end of processes.

Although not intended to be limiting, one or more embodiments of the present disclosure provide many benefits to a semiconductor device and the formation thereof. For example, embodiments of the present disclosure provide a semiconductor device with an array of MRAM cells in an MRAM region. A two-step etch process applied during the patterning of an MTJ stack allows spacer to be first deposited on sidewalls of at least the top magnetic plate of an MTJ, which prevents the top magnetic plate from being shorted to the bottom magnetic plate by redeposited metal particles during patterning process. There is clearly a reduction in MTJ bit error rate (BER). Also, due to the two-step etch process, the bottom magnetic plate is larger than the top magnetic plate, which provides a more uniform reference magnetic field. The MRAM cells of the present disclosure can be implemented as a standalone memory device or be implemented as an embedded memory that is integrated with logic devices. Furthermore, formation of this semiconductor device can be readily integrated into existing semiconductor fabrication processes.

In one exemplary aspect, the present disclosure is directed to a method. The method includes forming a magnetic tunnel junction (MTJ) stack over a substrate, the MTJ stack including a top magnetic layer, a barrier layer, and a bottom magnetic layer; patterning the top magnetic layer in a first etch process; after the patterning of the top magnetic layer, depositing a spacer on sidewalls of the patterned top magnetic layer; and patterning the bottom magnetic layer in a second etch process. In some embodiments, the first etch process also patterns the barrier layer and the spacer is deposited on a top surface of the bottom magnetic layer. In some embodiments, the second etch process also patterns the barrier layer and the spacer is deposited on a top surface of the barrier layer. In some embodiments, the first etch process also patterns the barrier layer and recesses a top surface of the bottom magnetic layer. In some embodiments, an edge portion of the bottom magnetic layer directly under the spacer is thinner than a center portion of the bottom magnetic layer directly under the barrier layer. In some embodiments, the bottom magnetic layer includes a pinned layer and a pinning layer, and the patterning of the top magnetic layer also patterns the pinned layer and exposes a top surface of the pinning layer. In some embodiments, the first etch process and the second etch process include different etch processes. In some embodiments, the first etch process is an ion beam etching (IBE) process and the second etch process includes a reactive ion etching (RIE) process. In some embodiments, the IBE process has a maximum penetration angle larger than 50°.

In another exemplary aspect, the present disclosure is directed to a method of forming a memory device. The method includes providing a substrate; forming a bottom electrode layer on the substrate; forming a magnetic tunnel junction (MTJ) stack on the bottom electrode layer, the MTJ stack including a top magnetic layer, a barrier layer, and a bottom magnetic layer; forming a top electrode layer on the MTJ stack; etching the top electrode layer, thereby exposing a top surface of the top magnetic layer; etching the top magnetic layer and the barrier layer; depositing a spacer on sidewalls of the top magnetic layer and the barrier layer; and after the depositing of the spacer, etching the bottom magnetic layer and the bottom electrode layer, thereby forming a plurality of MTJ elements. In some embodiments, the method further includes depositing a dielectric layer covering the spacer and filling trenches between the adjacent MTJ elements, wherein the dielectric layer traps air gaps in the trenches. In some embodiments, the etching of the top magnetic layer and the barrier layer also recesses a top surface of the bottom magnetic layer. In some embodiments, after the etching of the bottom magnetic layer and the bottom electrode layer, an edge portion of the bottom magnetic layer extends out of the sidewalls of the top magnetic layer and the barrier layer. In some embodiments, the etching of the top electrode layer includes a reactive ion etching (RIE) process, and the etching of the top magnetic layer and the barrier layer includes an ion beam etching (IBE) process. In some embodiments, the etching of the bottom magnetic layer and the bottom electrode layer includes an RIE process.

In another exemplary aspect, the present disclosure is directed to a semiconductor device. The semiconductor device includes a bottom electrode; a magnetic tunneling junction (MTJ) element over the bottom electrode, the MTJ element including a top magnetic plate, a bottom magnetic plate, and a barrier layer between the top magnetic plate and the bottom magnetic plate, an edge portion of the bottom magnetic plate extending out of sidewalls of the top magnetic plate; a spacer disposed on the sidewalls of the top magnetic plate but not on sidewalls of the bottom magnetic plate; and a top electrode over the top magnetic plate. In some embodiments, the spacer covers a top surface of the edge portion of the bottom magnetic plate. In some embodiments, the spacer covers sidewalls of the barrier layer. In some embodiments, a ratio between widths of the bottom magnetic plate and the top magnetic plate ranges from about 1.1:1 to about 1.5:1. In some embodiments, the semiconductor device further includes a dielectric layer covering the spacer and sidewalls of the bottom magnetic plate, wherein the dielectric layer traps metal particles between an outer sidewall of the spacer and the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a bottom electrode layer over a substrate;
   forming a magnetic tunnel junction (MTJ) stack over the bottom electrode layer, the MTJ stack including a top magnetic layer, a barrier layer, and a bottom magnetic layer;
   patterning the top magnetic layer in a first etch process;
   after the patterning of the top magnetic layer, depositing a spacer on sidewalls of the patterned top magnetic layer; and
   patterning the bottom magnetic layer and the bottom electrode layer in a second etch process, wherein after the second etch process sidewalls of the patterned bottom magnetic layer and the patterned bottom electrode layer are both exposed.

2. The method of claim 1, wherein the first etch process also patterns the barrier layer and the spacer is deposited on a top surface of the bottom magnetic layer.

3. The method of claim 1, wherein the second etch process also patterns the barrier layer and the spacer is deposited on a top surface of the barrier layer.

4. The method of claim 1, wherein the first etch process also patterns the barrier layer and recesses a top surface of the bottom magnetic layer.

5. The method of claim 4, wherein an edge portion of the bottom magnetic layer directly under the spacer is thinner than a center portion of the bottom magnetic layer directly under the barrier layer.

6. The method of claim 1, wherein the bottom magnetic layer includes a pinned layer and a pinning layer, and the patterning of the top magnetic layer also patterns the pinned layer and exposes a top surface of the pinning layer.

7. The method of claim 1, wherein the first etch process and the second etch process include different etch processes.

8. The method of claim 7, wherein the first etch process is an ion beam etching (IBE) process and the second etch process includes a reactive ion etching (RIE) process.

9. The method of claim 8, wherein the IBE process has a maximum penetration angle larger than 50°.

10. A method of forming a memory device, comprising:
    providing a substrate;
    forming a bottom electrode layer on the substrate;
    forming a magnetic tunnel junction (MTJ) stack on the bottom electrode layer, the MTJ stack including a top magnetic layer, a barrier layer, and a bottom magnetic layer;
    forming a top electrode layer on the MTJ stack;
    etching the top electrode layer, thereby exposing a top surface of the top magnetic layer;
    etching the top magnetic layer and the barrier layer;
    depositing a spacer on sidewalls of the top magnetic layer and the barrier layer; and
    after the depositing of the spacer, etching the bottom magnetic layer and the bottom electrode layer, thereby forming a plurality of MTJ elements.

11. The method of claim 10, further comprising:
    depositing a dielectric layer covering the spacer and filling trenches between the adjacent MTJ elements, wherein the dielectric layer traps air gaps in the trenches.

12. The method of claim 10, wherein the etching of the top magnetic layer and the barrier layer also recesses a top surface of the bottom magnetic layer.

13. The method of claim 10, wherein after the etching of the bottom magnetic layer and the bottom electrode layer, an edge portion of the bottom magnetic layer extends out of the sidewalls of the top magnetic layer and the barrier layer.

14. The method of claim 10, wherein the etching of the top electrode layer includes a reactive ion etching (RIE) process, and the etching of the top magnetic layer and the barrier layer includes an ion beam etching (IBE) process.

15. The method of claim 14, wherein the etching of the bottom magnetic layer and the bottom electrode layer includes an RIE process.

16. A method, comprising:
    forming a bottom electrode layer over a substrate;
    forming a magnetic tunnel junction (MTJ) stack over a substrate the bottom electrode layer, the MTJ stack including a top magnetic layer, a barrier layer, and a bottom magnetic layer;
    patterning the top magnetic layer in an ion beam etching (IBE) process;
    after the patterning of the top magnetic layer, depositing a spacer on sidewalls of the patterned top magnetic layer; and
    after the depositing of the spacer, patterning the bottom magnetic layer and the bottom electrode layer collectively in a reactive ion etching (RIE) process.

17. The method of claim 16, wherein the IBE process has an allowable maximum penetration angle larger than 50°.

18. The method of claim 16, wherein the IBE process also patterns the barrier layer to expose a top surface of the bottom magnetic layer.

19. The method of claim 16, wherein the spacer is deposited on a top surface of the barrier layer, and the RIE process also patterns the barrier layer.

20. The method of claim 16, wherein the bottom magnetic layer includes a pinning layer and a pinned layer over the pinning layer, and the IBE process also patterns the barrier layer and the pinner layer to expose a top surface of the pinning layer.

* * * * *